United States Patent
Harada et al.

(10) Patent No.: US 9,728,433 B2
(45) Date of Patent: Aug. 8, 2017

(54) ATTITUDE CHANGING APPARATUS, ALIGNING APPARATUS, ATTITUDE CHANGING METHOD AND ALIGNING METHOD

(71) Applicant: MURATA MANUFACTURING CO., LTD., Kyoto-fu (JP)

(72) Inventors: Masatoshi Harada, Nagaokakyo (JP); Atsushi Kudo, Nagaokakyo (JP); Keiji Matsumoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/271,510

(22) Filed: Sep. 21, 2016

(65) Prior Publication Data

US 2017/0011943 A1    Jan. 12, 2017

Related U.S. Application Data

(63) Continuation of application No. PCT/JP2015/056129, filed on Mar. 2, 2015.

(30) Foreign Application Priority Data

Mar. 27, 2014 (JP) .................................. 2014-066396
Dec. 26, 2014 (JP) .................................. 2014-266698

(51) Int. Cl.
*B65G 47/24* (2006.01)
*H01L 21/677* (2006.01)
(Continued)

(52) U.S. Cl.
CPC ...... *H01L 21/67718* (2013.01); *B65G 47/248* (2013.01); *B65G 47/848* (2013.01);
(Continued)

(58) Field of Classification Search
CPC .... B65G 47/24; B65G 47/244; B65G 47/248; B65G 47/1492
(Continued)

(56) References Cited

U.S. PATENT DOCUMENTS 3,120,888 A * 2/1964 Piel .................... B65G 47/1471
                                                                 198/380
3,598,223 A * 8/1971 Lauer ....................... A23N 4/14
                                                                 193/44

(Continued)

FOREIGN PATENT DOCUMENTS

JP    S64-024030 U    2/1989
JP    H03-015822 U    2/1991
(Continued)

OTHER PUBLICATIONS

International Search Report issued in PCT/JP2015/056129; mailed Jun. 2, 2015.
(Continued)

*Primary Examiner* — James R Bidwell
(74) *Attorney, Agent, or Firm* — Studebaker & Brackett PC

(57) ABSTRACT

An attitude changing apparatus which can change an attitude of a component with certainty without damaging the component. The component has a rectangular parallelepiped shape where a pair of rectangular end surfaces opposite to each other are connected to each other by four side surfaces. The component is stored in a cavity which penetrates between main surfaces of a conveyance member, the conveyance member is moved relative to a base, and the component is made to pass through an engaging groove formed on a reference surface of the base.

18 Claims, 16 Drawing Sheets

(51) Int. Cl.
*H01L 21/68* (2006.01)
*H01L 21/683* (2006.01)
*B65G 47/248* (2006.01)
*B65G 47/84* (2006.01)

(52) U.S. Cl.
CPC .... *H01L 21/6773* (2013.01); *H01L 21/67706* (2013.01); *H01L 21/67721* (2013.01); *H01L 21/68* (2013.01); *H01L 21/6838* (2013.01)

(58) Field of Classification Search
USPC .......... 198/390, 389, 400, 410, 416; 193/44
See application file for complete search history.

(56) References Cited

U.S. PATENT DOCUMENTS

| | | | | |
|---|---|---|---|---|
| 4,353,456 | A * | 10/1982 | Yamamoto | A61J 3/074 198/400 |
| 6,032,783 | A * | 3/2000 | Saito | H05K 13/022 193/44 |
| 6,116,840 | A * | 9/2000 | Saito | B23P 19/001 198/390 |
| 6,527,101 | B1 | 3/2003 | Miyamoto | |
| 7,815,033 | B2 * | 10/2010 | Feierabend | B65G 47/1471 198/389 |
| 8,474,597 | B2 * | 7/2013 | Pier | B65G 47/1407 198/389 |
| 2003/0089184 | A1 | 5/2003 | Kimura et al. | |

FOREIGN PATENT DOCUMENTS

| | | |
|---|---|---|
| JP | H05-095920 A | 4/1993 |
| JP | 2000-072230 A | 3/2000 |
| JP | 2002-255336 A | 9/2002 |
| JP | 2009-249068 A | 10/2009 |
| WO | 2006/027793 A1 | 3/2006 |

OTHER PUBLICATIONS

Written Opinion issued in PCT/JP2015/056129; mailed Jun. 2, 2015.
International Search Report issued in PCT/JP2015/056128; mailed Jun. 2, 2015.
Written Opinion issued in PCT/JP2015/056128; mailed Jun. 2, 2015.
International Preliminary Report on Patentability issued in PCT/JP2015/056128; issued on Sep. 13, 2016.

* cited by examiner

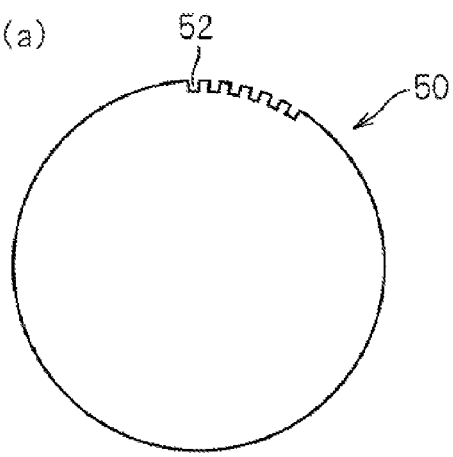
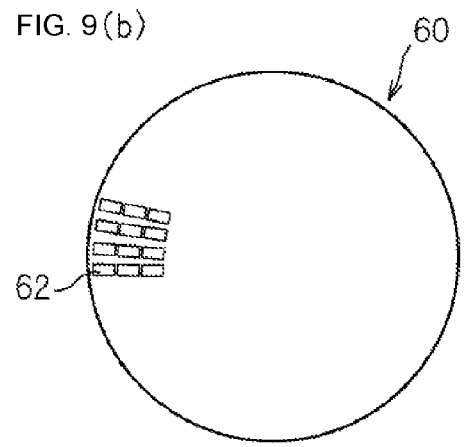
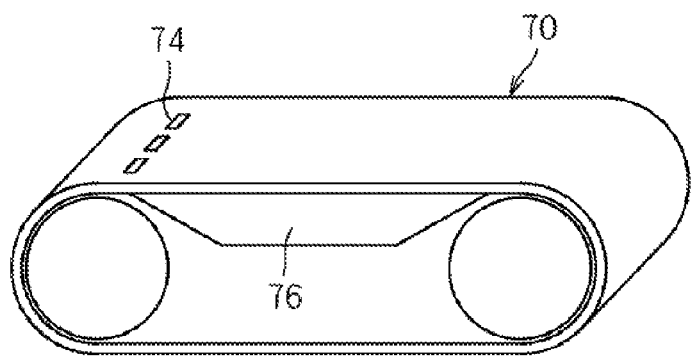
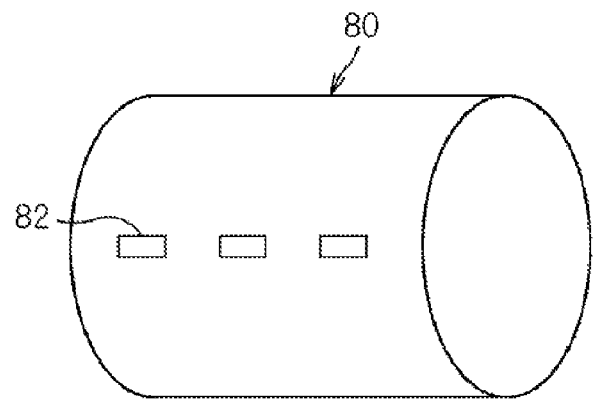

PRIOR ART

ATTITUDE CHANGING APPARATUS, ALIGNING APPARATUS, ATTITUDE CHANGING METHOD AND ALIGNING METHOD

CROSS REFERENCE TO RELATED APPLICATIONS

This application claims benefit of priority to Japanese Patent Application 2014-066396 filed Mar. 27, 2014, Japanese Patent Application 2014-266698 filed Dec. 26, 2014, and to International Patent Application No. PCT/JP2015/056129 filed Mar. 2, 2015, the entire content of which is incorporated herein by reference.

TECHNICAL FIELD

The present disclosure relates to an attitude changing apparatus, an aligning apparatus and an attitude changing method, and an aligning method, and more particularly to a technique for changing an attitude of a component having a rectangular parallelepiped shape.

BACKGROUND

Conventionally, there has been known an apparatus which changes an attitude of a component having a rectangular parallelepiped shape.

For example, as shown in FIG. 19 which is an explanatory view, in changing an attitude of a chip component P having a rectangular parallelepiped shape into a vertical position from a horizontal position, the chip component P in the horizontal position is sucked into and held by a cavity 104 which is formed by cutting along an outer periphery of a rotor 101, and the rotor 101 is rotated relative to a base 103. A guide surface 111 is formed on the base 103, a radially outer side of the chip component P is lifted by the guide surface 111 along with the rotation of the rotor 101 thus bringing the chip component P into the vertical position.

In addition, as shown in FIG. 20 which is an explanatory view, in changing the attitude of the chip component P into the horizontal position from the vertical position, the chip component P in the vertical position is sucked into and held by the cavity 104 formed by cutting along the outer periphery of the rotor 101, and a biasing member 120 is disposed above the rotor 101. Along with the rotation of the rotor 101, a contact surface 121 of the biasing member 120 is brought into contact with an upper portion of the chip component P so that the upper portion of the chip component P is biased by the contact surface 121 whereby the chip component P is brought into the horizontal position (see JP-A-2000-72230, for example).

SUMMARY

Problem to be Solved by the Disclosure

However, when a contact surface of the biasing member is brought into contact with the component and biases the component, the component is damaged.

In the latter case where the attitude of the chip component is changed into the horizontal position from the vertical position, particularly, depending on a magnitude of a frictional force between the chip component and the cavity or between the chip component and the base, the position of a fulcrum of rotation where the chip component is brought into contact with the base when the chip component is inclined changes. Since irregularities are liable to be generated in the frictional force, the position of the fulcrum of the rotation is liable to change. When the fulcrum of the rotation of the chip component is displaced radially outward, inclination of the chip component is insufficient thus giving rise to a possibility that the attitude of the chip component is not changed.

Further, in changing the attitude of the chip component from the horizontal position to the vertical position, it is necessary to rotate the chip component such that the chip component projects to the outside from an outer periphery of the rotor. Accordingly, the chip component can be changed into the vertical position only in the case where the rotor having notched cavities on an outer periphery thereof is used.

The present disclosure has been made in view of such circumstances, and it is an object of the present disclosure to provide an attitude changing apparatus, an aligning apparatus, an attitude changing method and an aligning method which can change an attitude of a component with certainty without damaging the component.

Means for Solving the Problem

To achieve the above-mentioned object, the present disclosure provides a first attitude changing apparatus having a following configuration.

The first attitude changing apparatus is used for a component having a rectangular parallelepiped shape where the component includes a pair of rectangular end surfaces which are opposite to each other and four side surfaces which connect the end surfaces to each other. The first attitude changing apparatus includes (a) a base having a reference surface and a first engaging groove formed in a groove shape with respect to the reference surface; and (b) a conveyance member disposed along the reference surface of the base and having first and second main surfaces which are opposite to each other and a cavity which penetrates between the first and second main surfaces, the cavity being formed such that the component is stored in the cavity either in a state where the end surface of the component is brought into contact with the reference surface or in a state where any one of side surfaces of the component is brought into contact with the reference surface, and the conveyance member being configured to move relative to the base such that the cavity moves while facing the first engaging groove from a first end to a second end of the first engaging groove. The first engaging groove includes: a first groove bottom portion in a linear shape which connects the first end and the second end of the first engaging groove to each other; a first inclined surface which is disposed adjacently to the first groove bottom portion and extends to one side of the first groove bottom portion; and a second inclined surface which is disposed adjacently to the first groove bottom portion and extends to the other side of the first groove bottom portion. The first inclined surface is configured to suck and hold the component. The first inclined surface is formed such that the inclination of the first inclined surface with respect to the reference surface in a first orthogonal cross section orthogonal to the first groove bottom portion is increased as the first engaging groove extends toward the second end from the first end in at least a partial region of the engaging groove from the first end to a first predetermined position, and with respect to the component which is stored in the cavity such that either one of the end surfaces faces the reference surface in the first end, as the component is conveyed along the first engaging groove along with the relative movement of the conveyance member with respect to the base while the end surface of the component stored in the cavity is sucked to and held by the first inclined surface, the inclination of the end surface of the component with respect to the reference surface is increased and the inclination of the pair of side surfaces of the component which is opposite to each other with respect to the reference surface is decreased. The second inclined surface is formed such that the side surface of the component is moved to the reference surface along with the conveyance of the component while the side surface of the component which is stored and conveyed in the cavity is supported in at least a partial portion of the engaging groove from the first predetermined position to the second end, and the side surface of the component is brought into contact with the reference surface when the component passes the second end of the first engaging groove.

In the above-mentioned configuration, the component stored in the cavity is conveyed by moving the conveyance member relative to the base. When the component which is stored in the cavity such that the end surface is brought into contact with the reference surface reaches the first end of the first engaging groove, the end surface is inclined by being sucked to and held by the first inclined surface, and after the component passes a predetermined position, the side surface is moved to the reference surface while being supported by the second inclined surface. With respect to the component whose end surface is brought into contact with the reference surface, the component is to have an attitude where the side surface is brought into contact with the reference surface when the component passes the second end of the first engaging groove. That is, with respect to a component in an attitude where a center line which connects the end surfaces to each other is perpendicular to the reference surface, the attitude of the component is changed into an attitude where the center line is parallel to the reference surface by passing the first engaging groove.

To achieve the above-mentioned object, the present disclosure provides a second attitude changing apparatus having a following configuration.

The second attitude changing apparatus is used for a component having a rectangular parallelepiped shape where the component includes a pair of rectangular end surfaces which are opposite to each other and four side surfaces which connect the end surfaces to each other. The second attitude changing apparatus includes: (a) a base having a reference surface and a first engaging groove formed in a groove shape with respect to the reference surface; and (b) a conveyance member disposed along the reference surface of the base and having first and second main surfaces which are opposite to each other and a cavity which penetrates between the first and second main surfaces, the cavity being formed such that the component is stored in the cavity either in a state where the end surface of the component is brought into contact with the reference surface or in a state where any one of side surfaces of the component is brought into contact with the reference surface, the conveyance member being configured to move relative to the base such that the cavity moves while facing the first engaging groove from a first end to a second end of the first engaging groove. The first engaging groove includes: a first groove bottom portion in a linear shape which connects the first end and the second end of the first engaging groove to each other; a first inclined surface which is disposed adjacently to the first groove bottom portion and extends to one side of the first groove bottom portion; and a second inclined surface which is disposed adjacently to the first groove bottom portion and extends to the other side of the first groove bottom portion.

The first inclined surface is configured to suck and hold the component. The first inclined surface is formed such that the inclination of the first inclined surface with respect to the reference surface in a first orthogonal cross section orthogonal to the first groove bottom portion is increased as the first engaging groove extends toward the second end from the first end in at least a partial region of the engaging groove from the first end to a first predetermined position, and with respect to the component which is stored in the cavity such that any one of the side surfaces faces the reference surface in the first end, as the component is conveyed along the first engaging groove along with the relative movement of the conveyance member with respect to the base while the side surface of the component stored in the cavity is sucked to and held by the first inclined surface, the inclination of the pair of side surfaces of the component which is opposite to each other with respect to the reference surface is increased and the inclination of the end surface of the component with respect to the reference surface is decreased. The second inclined surface is formed such that the end surface of the component is moved to the reference surface along with the conveyance of the component while the end surface of the component which is stored and conveyed in the cavity is supported in at least a partial region of the engaging groove from the first predetermined position to the second end, and the end surface of the component is brought into contact with the reference surface when the component passes the second end of the first engaging groove.

In the above-mentioned configuration, the component stored in the cavity is conveyed by moving the conveyance member relative to the base. When the component which is stored in the cavity such that the side surface is brought into contact with the reference surface reaches the first end of the first engaging groove, the side surface is inclined by being sucked to and held by the first inclined surface, and after the component passes a predetermined position, the end surface is moved to the reference surface while being supported by the second inclined surface. With respect to the component whose side surface is brought into contact with the reference surface, the component is to have an attitude where the end surface is brought into contact with the reference surface when the component passes the second end of the first engaging groove. That is, with respect to a component in an attitude where a center line which connects the end surfaces to each other is parallel to the reference surface, the attitude of the component is changed into an attitude where the center line is perpendicular to the reference surface by passing the first engaging groove.

With the above-mentioned first and second configurations, the component is rotated using the first groove bottom portion of the first engaging groove in the vicinity of the first predetermined position or a portion in the vicinity of the first groove bottom portion as a fulcrum of rotation and hence, the disturbance of the position of the fulcrum of rotation can be suppressed whereby the attitude of the component can be surely changed. Further, the attitude of the component can be changed without damaging the component.

It is preferable that a first suction opening be formed in the first inclined surface, and the component can be sucked to and held by the first inclined surface as the component is sucked in vacuum through the first suction opening. It is preferable that a second suction opening be formed in the second inclined surface, and the component can be sucked to and held by the second inclined surface as the component is sucked in vacuum through the second suction opening.

In this case, the suction and holding of the component can be realized with the simple configuration.

It is preferable that a third suction opening which overlaps with the first inclined surface, the first groove bottom portion and the second inclined surface be formed at the first predetermined position or in a region in the vicinity of the first predetermined position, and the component can be sucked to and held by the first engaging groove as the component is sucked in vacuum through the third suction opening.

In this case, the third suction opening is formed along the first groove bottom portion so as to straddle over the first predetermined position. By sucking and holding the component by the third sucking opening such that a corner of the component approaches the first groove bottom portion, the attitude of the component is minimally disturbed at the time of changing the attitude of the component and hence, the corner of the component minimally enters the first suction opening formed in the first inclined surface and the second suction opening formed in the second inclined surface. Accordingly, it is possible to prevent the occurrence of a defect such as flaws or cracks on the component caused by entering of the corner of the component into the first suction opening formed in the first inclined surface and the second suction opening formed in the second inclined surface.

It is preferable that one opening center of the first suction opening on the first inclined surface, one opening center of the second suction opening on the second inclined surface or one opening center of the third suction opening on the first inclined surface or the second inclined surface be, assuming that the center of gravity of the component is included in an imaginary plane which passes the opening center and is orthogonal to first groove bottom portion, the component brought into contact with at least one of the first inclined surface and the second inclined surface. The component is disposed in the first engaging groove such that a corner of the component approaches closest to the first groove bottom portion, positioned within one region which includes the groove bottom portion among four regions obtained by dividing the imaginary plane by a first plane which is disposed parallel to the end surface or the side surface of the component which faces the first inclined surface and passes the center of gravity of the component and a second plane which is disposed parallel to the end surface or the side surface of the component which faces the second inclined surface and passes the center of gravity of the component or on a boundary line of the region.

In this case, the disturbance of the position of the component in the first engaging groove is suppressed and hence, an attitude changing operation of the component can be performed in a stable manner.

It is preferable that an auxiliary suction unit which sucks the component stored in the cavity be provided to the conveyance member. A suction force of the auxiliary suction unit is set smaller than a force for sucking and holding the component by the first and/or second inclined surfaces in an area in the vicinity of the first predetermined position.

In this case, by pulling the component stored in the cavity by the auxiliary suction unit, the positional displacement of the component can be prevented and hence, the attitude changing operation of the component can be performed in a stable manner. Further, falling or positional displacement of the component from the cavity can be prevented and hence, the reference surface can be easily arranged in the direction other than the horizontal direction.

It is preferable that the inclination of the first inclined surface with respect to the reference surface in the first orthogonal cross section be gradually increased as the first engaging groove extends toward the second end from the first end.

In this case, the attitude changing operation of the component can be easily made stable.

The present disclosure also provides an aligning apparatus having the following configuration to overcome the above-mentioned drawback.

The aligning apparatus includes: (a) the above-mentioned first attitude changing apparatus; and (b) a component supply unit which is configured to supply the component to the cavity in such a manner that the end surface of the component is brought into contact with the reference surface or in such a manner that the side surface of the component is brought into contact with the reference surface. The first engaging groove and the cavity are formed such that the component which is supplied to the cavity by the component supply unit in such a manner that the side surface of the component is brought into contact with the reference surface is to have an attitude where the side surface of the component is brought into contact with the reference surface when the component is conveyed while straddling over the first engaging groove in a state where the component is stored in the cavity, passes the first engaging groove, and passes the second end of the first engaging groove.

According to the aligning apparatus having the above-mentioned configuration, the component is in a state where the end surface of the component is brought into contact with the reference surface or in a state where the side surface of the component is brought into contact with the reference surface when the component is supplied to the cavity and hence, the attitude of the component after being conveyed along the engaging groove can be aligned to an attitude where the side surface of the component is brought into contact with the reference surface.

It is preferable that the base has a second engaging groove formed in a groove shape with respect to the reference surface. The second engaging groove includes: a second groove bottom portion in a linear shape which connects the third end and the fourth end of the second engaging groove to each other; a third inclined surface which is disposed adjacently to the second groove bottom portion and extends toward one side of the second groove bottom portion; and a fourth inclined surface which is disposed adjacently to the second groove bottom portion and extends to the other side of the second groove bottom portion. The third inclined surface is configured to suck and hold the component. The conveyance member moves relative to the base such that the cavity moves in a facing manner with the second engaging groove from the third end to the fourth end of the second engaging groove. The third inclined surface is formed such that inclination of the third inclined surface with respect to the reference surface in a second orthogonal cross section orthogonal to the second groove bottom portion is increased toward the fourth end from the third end of the second engaging groove in at least a portion of a region from the third end to a second predetermined position of the second engaging groove, and inclination of the side surface of the component with respect to the reference surface is increased and inclination of the end surface of the component with respect to the reference surface is decreased along with the conveyance of the component stored in the cavity from the third end to the fourth end of the second engaging groove along the second engaging groove along with the relative movement of the conveyance member with respect to the base while the side surface of the component stored in the cavity is sucked to and held by the third inclined surface.

The fourth inclined surface is formed such that, in at least one region between the second predetermined position to the fourth end of the engaging groove, the engaging groove is brought into contact with the end surface of the component, and the end surface of the component is moved to the reference surface along with the conveyance of the component, and the end surface of the component is in contact with the reference surface when the component passes the fourth end of the second engaging groove. The fourth inclined surface is formed such that the fourth inclined surface is brought into contact with the end surface of the component which is stored in the cavity and is conveyed, the end surface of the component is moved to the reference surface along with the conveyance of the component in at least a partial region of the engaging groove from the second predetermined position to the fourth end, and the end surface of the component is brought into contact with the reference surface when the component passes the fourth end of the second engaging groove.

In this case, the component is in a state where the end surface of the component is brought into contact with the reference surface or in a state where the side surface of the component is brought into contact with the reference surface when the component is supplied to the cavity and hence, the attitude of the component after being conveyed along the first engaging groove and, subsequently, conveyed along the second engaging groove can be aligned to an attitude where the end surface of the component is brought into contact with the reference surface.

The present disclosure also provides a first attitude changing method having the following configuration to overcome the above-mentioned drawbacks.

The first attitude changing method is used for a component having a rectangular parallelepiped shape where the component includes a pair of rectangular end surfaces which are opposite to each other and four side surfaces which connect the end surfaces to each other. The first attitude changing method includes first to third steps. In the first step, there are prepared (a) a base which is configured such that the base has a reference surface and a first engaging groove formed in a groove shape with respect to the reference surface, the first engaging groove includes: a first groove bottom portion in a linear shape which connects a first end and a second end of the first engaging groove to each other; and a first inclined surface which is disposed adjacently to the first groove bottom portion and extends to one side of the first groove bottom portion; and a second inclined surface which is disposed adjacently to the first groove bottom portion and extends to the other side of the first groove bottom. The first inclined surface is configured to suck and hold the component. The first inclined surface is formed such that the inclination of the first inclined surface with respect to the reference surface in a first orthogonal cross section orthogonal to the first groove bottom portion is increased as the first engaging groove extends toward the second end from the first end in at least a partial region of the engaging groove from the first end to a first predetermined position, and (b) a conveyance member disposed along the reference surface of the base and having first and second main surfaces which are opposite to each other and a cavity which penetrates between the first and second main surfaces, the cavity being formed such that the component is stored in the cavity either in a state where the end surface of the component is brought into contact with the reference surface or in a state where any one of the side surfaces of the component is brought into contact with the reference surface. In the second step, at least one component is stored into the cavity such that either one of the end surfaces of the component faces the reference surface. In the third step, the conveyance member is moved relative to the base such that the cavity moves while facing the first engaging groove from a first end to a second end of the first engaging groove thus moving the component stored in the cavity along the first engaging groove in a state where the component is stored in the cavity. The third steps includes: (i) a first sub step of increasing the inclination of the end surface of the component with respect to the reference surface and decreasing the inclination of a pair of the side surfaces of the component opposite to each other with respect to the reference surface by conveying the component stored in the cavity while the end surface of the component is sucked to and held on the first inclined surface; and (ii) a second sub step of moving the side surface of the component to the reference surface while the side surface of the component inclined in the first sub step is supported on the second inclined surface. The component supplied to the cavity in such a manner that the end surface of the component is brought into contact with the reference surface in the second step is changed into an attitude where the side surface of the component is brought into contact with the reference surface when the component passes the second end of the first engaging groove through the third step.

In the above-mentioned third step, when the component stored in the cavity is made to face the first engaging groove from the first end to the second end of the first engaging groove, the component which is stored in the cavity such that the end surface is brought into contact with the reference surface has the end surface thereof inclined by being sucked and held on the first inclined surface. After the component passes the predetermined position, the component is moved to the reference surface while the side surface of the component is supported by the second inclined surface. With respect to the component whose end surface is brought into contact with the reference surface, the component is to have an attitude where the side surface is brought into contact with the reference surface after the component passes the second end of the first engaging groove. That is, with respect to a component in an attitude where a center line which connects the end surfaces to each other is perpendicular to the reference surface, the attitude of the component is changed into an attitude where the center line is parallel to the reference surface by passing the engaging groove.

The present disclosure also provides a second attitude changing method having the following configuration to overcome the above-mentioned drawbacks.

The second attitude changing method is used for a component having a rectangular parallelepiped shape where the component includes a pair of rectangular end surfaces which are opposite to each other and four side surfaces which connect the end surfaces to each other. The second attitude changing method includes first to third steps. In the first step, there are prepared (a) a base which is configured such that the base has a reference surface and a first engaging groove formed in a groove shape with respect to the reference surface, the first engaging groove includes: a first groove bottom portion in a linear shape which connects a first end and a second end of the first engaging groove to each other; a first inclined surface which is disposed adjacently to the first groove bottom portion and extends to one side of the first groove bottom portion; and a second inclined surface which is disposed adjacently to the first groove bottom portion and extends to the other side of the first groove bottom portion, the first inclined surface is configured to suck and hold the component, the first inclined surface is formed such that the inclination of the first inclined surface with respect to the reference surface in a first orthogonal cross section orthogonal to the first groove bottom portion is increased as the first engaging groove extends toward the second end from the first end in at least a partial region of the engaging groove from the first end to a first predetermined position, and (b) a conveyance member disposed along the reference surface of the base and having first and second main surfaces which are opposite to each other and a cavity which penetrates between the first and second main surfaces, the cavity being formed such that the component is stored in the cavity either in a state where the end surface of the component is brought into contact with the reference surface or in a state where any one of side surfaces of the component is brought into contact with the reference surface. In the second step, the component is stored in the cavity. In the third step, the conveyance member is moved relative to the base such that the cavity moves while facing the first engaging groove from the first end to the second end of the first engaging groove thus moving the component stored in the cavity along the first engaging groove in a state where the component is stored in the cavity. The third step includes: (i) a first sub step of increasing the inclination of the pair of side surfaces of the component opposite to each other with respect to the reference surface and decreasing the inclination of the end surface of the component with respect to the reference surface by conveying the component stored in the cavity while the side surface of the component is sucked to and held on the first inclined surface; and (ii) a second sub step of moving the end surface of the component to the reference surface while the end surface of the component inclined in the first sub step is supported on the second inclined surface. The component supplied to the cavity in such a manner that the side surface of the component is brought into contact with the reference surface in the second step is changed into an attitude where the end surface of the component is brought into contact with the reference surface when the component passes the second end of the first engaging groove through the third step.

In the above-mentioned third step, when the component stored in the cavity is made to face the first engaging groove from the first end to the second end of the first engaging groove, the component which is stored in the cavity such that the side surface is brought into contact with the reference surface has the side surface thereof inclined by being sucked and held on the first inclined surface. After the component passes the predetermined position, the component is moved to the reference surface while the end surface of the component is supported by the second inclined surface. With respect to the component whose end surface is brought into contact with the reference surface, the component is to have an attitude where the end surface is brought into contact with the reference surface after the component passes the second end of the first engaging groove. That is, with respect to a component in an attitude where a center line which connects the end surfaces to each other is parallel to the reference surface, the attitude of the component is changed into an attitude where the center line is perpendicular to the reference surface by passing the engaging groove.

With the above-mentioned first and second attitude changing methods, the component is rotated using the first groove bottom portion of the first engaging groove or a portion in the vicinity of the first groove bottom portion as a fulcrum of rotation and hence, the disturbance of the position of the fulcrum of rotation can be suppressed whereby the attitude of the component can be surely changed. Further, the attitude of the component can be changed without damaging the component.

In the third step, it is preferable that the component be sucked and held on the first engaging groove by sucking the component in vacuum through a first suction opening formed in the first inclined surface, by sucking the component in vacuum through a second suction opening formed in the second inclined surface, and by sucking the component in vacuum through a third suction opening which is disposed in the vicinity of the first predetermined position and overlapped with the first inclined surface, the first groove bottom portion and the second inclined surface.

In this case, the third suction opening is formed along the first groove bottom portion so as to straddle over the first predetermined position. With respect to the component conveyed in the third step, when the disturbance of the attitude of the component, for example, the entrance of a corner of the component into the first suction opening or the second suction opening occurs, there is a possibility that a defect such as flaws or cracks occurs in the component. According to the present disclosure, the corner of the component is sucked to and held by the third sucking opening, the corner of the component minimally enters the first or the second suction opening. Accordingly, it is possible to suppress the occurrence of a defect such as flaws or cracks on the component.

The present disclosure also provides an aligning method having the following configuration to overcome the above-mentioned drawbacks.

The aligning method includes the above-mentioned first attitude changing method. In the second step, the component is supplied to the cavity in such a manner that the end surface of the component is brought into contact with the reference surface or in such a manner that the side surface of the component is brought into contact with the reference surface. The third step includes (iii) a third sub step where the component which is stored in the cavity and has the side surface thereof brought into contact with the reference surface is moved along the first engaging groove while the component is made to straddle over the first engaging groove in a state where the component is stored in the cavity. Attitudes of all components which pass the second end of the first engaging groove through the third step are changed into an attitude where the side surface of the component is brought into contact with the reference surface.

In this case, the component is in a state where the end surface of the component is brought into contact with the reference surface or in a state where the side surface of the component is brought into contact with the reference surface when the component is supplied to the cavity and hence, the attitude of the component after being conveyed along the first engaging groove can be aligned to an attitude where the side surface of the component is brought into contact with the reference surface.

It is preferable that the base have a second engaging groove formed in a groove shape with respect to the reference surface. The second engaging groove includes: a second groove bottom portion in a linear shape which connects a third end and a fourth end of the second engaging groove to each other; a third inclined surface which is disposed adjacently to the second groove bottom portion and extends toward one side of the second groove bottom portion; and a fourth inclined surface which is disposed adjacently to the second groove bottom portion and extends toward the other side of the second groove bottom portion. The third inclined surface is configured to suck and hold the component. The third inclined surface is formed such that the inclination of the third inclined surface with respect to the reference surface in a second orthogonal cross section orthogonal to the second groove bottom portion is increased in a direction toward the fourth end from the third end of the second engaging groove in at least a partial region from the third end to a second predetermined position of the second engaging groove. The aligning method further includes, after the third step, a fourth step where the component stored in the cavity is moved from the third end to the fourth end of the second engaging groove along the second engaging groove in a state where the component is stored in the cavity by moving the conveyance member relative to the base such that the cavity is moved from the third end to the fourth end of the second engaging groove while the cavity faces the second engaging groove. The fourth step includes: (iv) a fourth sub step where the inclination of the side surface of the component with respect to the reference surface is increased and the inclination of the end surface of the component with respect to the reference surface is decreased by converting the component while sucking and holding the side surface of the component stored in the cavity on the third inclined surface; and (v) a fifth sub step where the end surface of the component is moved to the reference surface while the end surface of the component inclined in the fourth sub step is supported by the second inclined surface. All components which pass the fourth end of the second engaging groove through the fourth step are brought into an attitude where the end surface of the component is brought into contact with the reference surface.

In this case, the component is in a state where the end surface of the component is brought into contact with the reference surface or in a state where the side surface of the component is brought into contact with the reference surface when the component is supplied to the cavity and hence, the attitude of the component after being conveyed along the first engaging groove and thereafter being conveyed along the second engaging groove can be aligned to an attitude where the end surface of the component is brought into contact with the reference surface.

Advantageous Effect of the Disclosure

The present disclosure provides an attitude changing apparatus, an aligning apparatus, an attitude changing method and an aligning method which can change an attitude of a component with certainty by suppressing the disturbance of the position of a fulcrum of rotation in the changing of attitude of a component without damaging a component.

BRIEF DESCRIPTION OF THE DRAWINGS

FIG. 1 is not a perspective view of the component and shows only a side surface of the component (embodiment 1).

FIGS. 9(*a*) and 9(*b*) are plan views showing the schematic configuration of a rotor (modification 2).

FIG. 10 is a schematic view showing the schematic configuration of an endless belt (modification 3).

FIG. 11 is a schematic view showing the schematic configuration of a rotary drum (modification 4).

DETAILED DESCRIPTION

Embodiment 1

Embodiments of the present disclosure are described with reference to drawings hereinafter.

An attitude changing apparatus according to an embodiment 1 is described with reference to FIG. 1 to FIG. 7.

Figure 1:
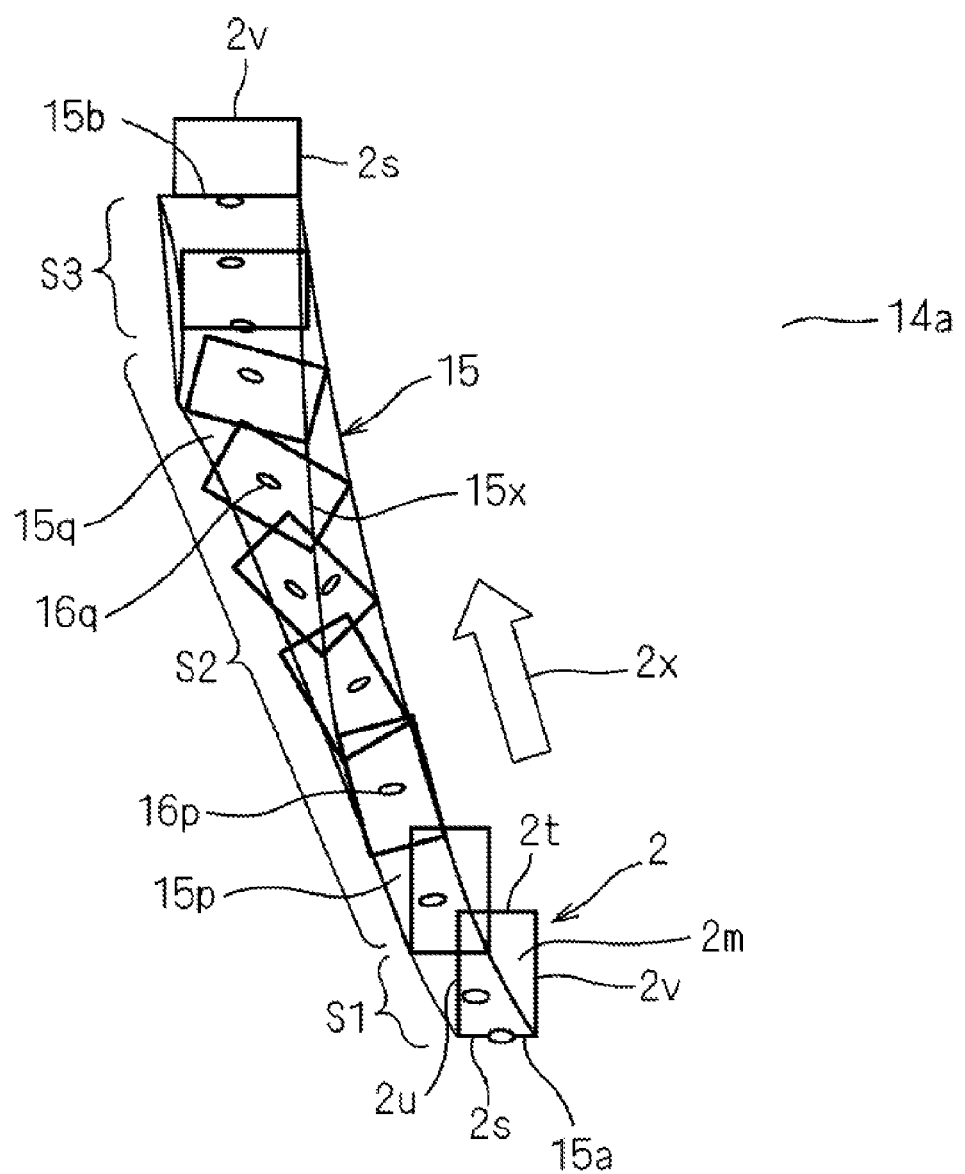
FIG. 1 is an explanatory view (perspective view) showing the movement of a component in an attitude changing apparatus.
Figure 2:
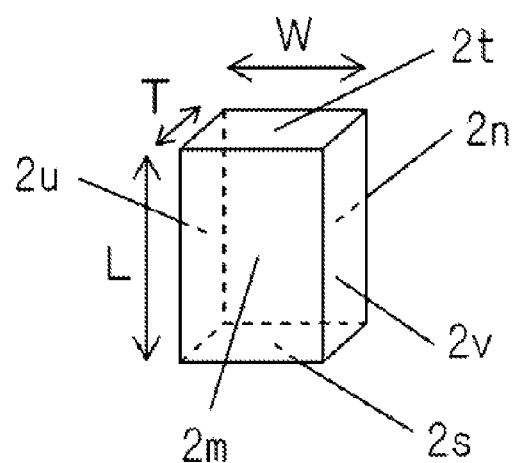
FIG. 2 is a perspective view of a component in a vertical position (embodiment 1).

FIG. 1 is an explanatory view (perspective view) showing the movement of a component 2 in an attitude changing apparatus 1 of the embodiment 1. FIG. 1 is not a perspective view of the component 2 and shows only a side surface 2*m* of the component 2. FIG. 2 is a perspective view of the component 2 in a vertical position.

As shown in FIG. 2, the component 2 has a rectangular parallelepiped shape, and has rectangular end surfaces 2*s*, 2*t* which are opposite to each other and four side surfaces 2*m*, 2*n*, 2*u*, 2*v* which connect the end surfaces 2*s*, 2*t* to each other. For example, the component 2 is an electronic component such as a multi-layer ceramic capacitor, a thermistor or a coil. Assuming a length (distance) between the end surfaces 2*s*, 2*t* of the component 2 as L, a length (distance) between the pair of side surfaces 2*m*, 2*n* of the component 2 on one side which are opposite to each other as T, and a length (distance) between the pair of side surfaces 2*u*, 2*v* of the component 2 on the other side which are opposite to each other as W, and the relationships of L>W is established. For example, L falls within a range of from 0.1 to 5 mm, W falls within a range of from 0.05 to 4 mm, and T falls within a range of from 0.01 to 4 mm.

As shown in FIG. 1, the component 2 having a rectangular parallelepiped shape which is brought into contact with a reference surface 14a is moved in a predetermined direction indicated by an arrow 2x. In a first zone S1 disposed on a one-end 15a side which is a first end of a first engaging groove 15 (hereinafter simply referred to as "engaging groove 15"), the component 2 is lowered from the reference surface 14a without being inclined. In a second zone S2 disposed in the middle of the engaging groove 15, the component 2 is rotated by 90°. In a third zone S3 disposed on the other end 15b side which is a second end of the engaging groove 15, the component 2 is elevated to the reference surface 14a. The component 2 is moved from one end 15a of the engaging groove 15 to a first inclined surface 15p of the engaging groove 15 where a first suction opening 16p is formed while the end surface 2s of the component 2 is sucked and held by the first inclined surface 15p. After the component 2 passes a first predetermined position disposed between one end 15a and the other end 15b of the engaging groove 15 (hereinafter simply referred to as a "predetermined position"), the component 2 is moved to a second inclined surface 15q where a second suction opening 16q is formed while the side surface 2u of the component 2 is sucked and held by the second inclined surface 15q.

By adopting the configuration where the component 2 is lowered from the reference surface 14a without being inclined in the first zone S1 and the component 2 is elevated to the reference surface 14a without being inclined in the third zone, the attitude changing apparatus can move the component 2 stably along the engaging groove 15.

The attitude changing apparatus may be configured such that the component 2 is lowered from the reference surface 14a while being inclined in the first zone S1 and the component 2 is elevated to the reference surface 14a while being inclined in the third zone S3. The direction that the component 2 is moved may be suitably selected. That is, the component 2 may be moved in an arcuate shape, in a linear shape or the like.

Figure 3:
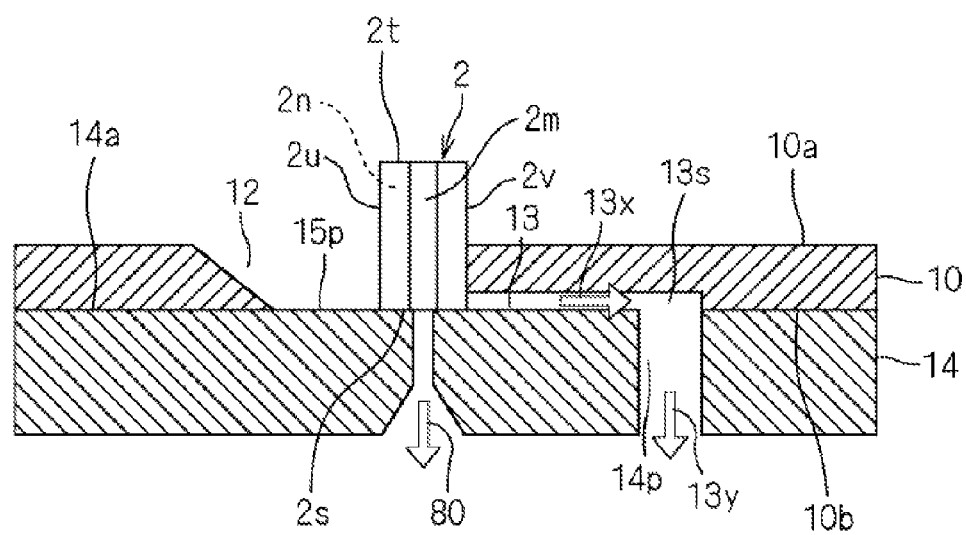
FIG. 3 is a cross-sectional view showing a main component of the configuration of an attitude changing apparatus (embodiment 1).
Figure 4:
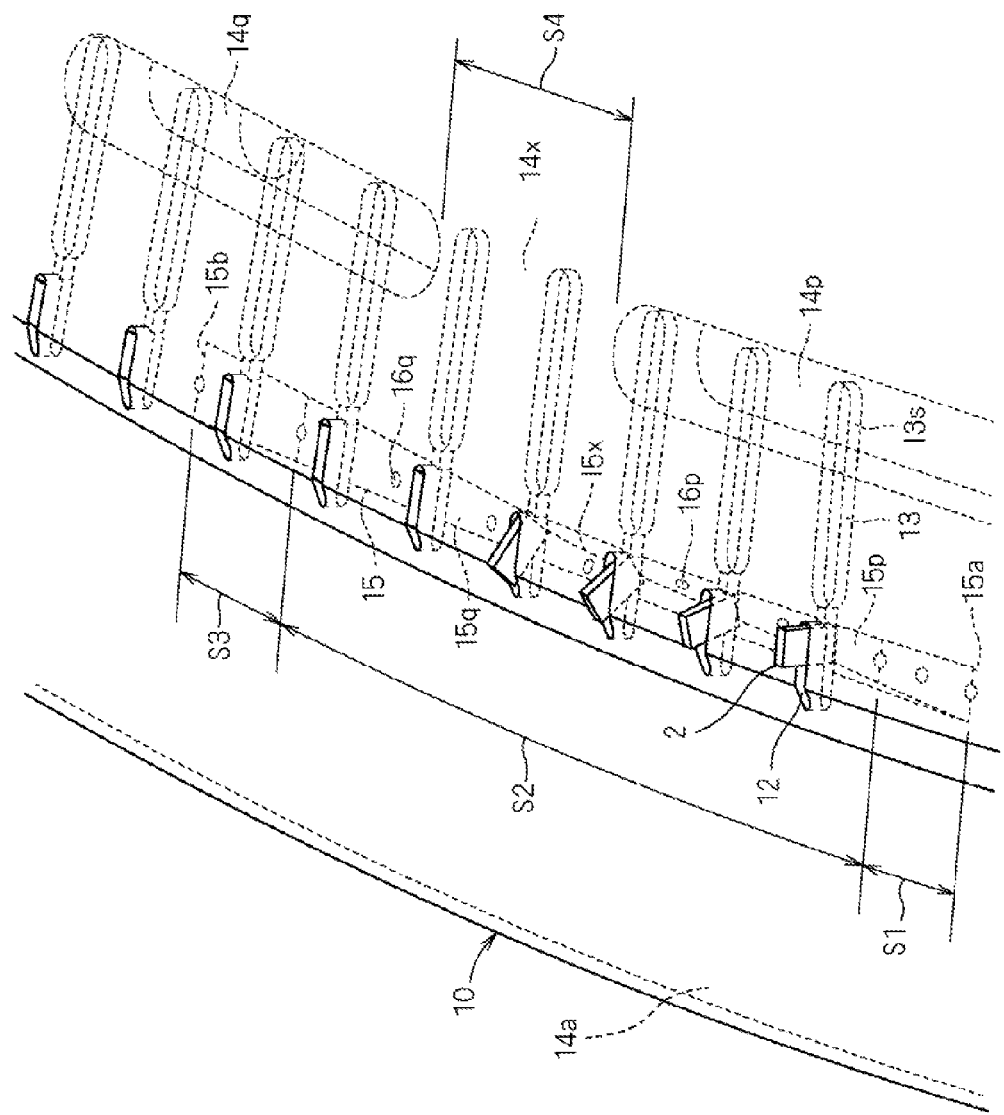
FIG. 4 is a perspective view showing the main component of the configuration of the attitude changing apparatus (embodiment 1).

FIG. 3 is a cross-sectional view showing of a main part of the configuration of the attitude changing apparatus. FIG. 4 is a perspective view showing the main part of the configuration of the attitude changing apparatus. As shown in FIG. 3 and FIG. 4, the attitude changing apparatus includes: a base 14 having the reference surface 14a; a rotor 10 which is a conveyance member; and a component supply unit not shown in the drawing. The attitude changing apparatus can be used for the selection of the components 2 based on a characteristic, the selection of the components 2 based on external appearance, external electrode forming, lead mounting, and the like.

The rotor 10 has a disc shape, and has first and second main surfaces 10a, 10b which are opposite to each other. The second main surface 10b of the rotor 10 faces the reference surface 14a of the base 14, and the rotor 10 is continuously or intermittently rotated with respect to the base 14. As a material for the rotor 10, a resin, metal, glass, a glass epoxy resin, ceramics such as zirconia or the like can be selectively used.

A plurality of cavities 12 are formed in the rotor 10 in a penetrating manner between the first and second main surfaces 10a, 10b. Cavities 12 extend radially with respect to the center of rotation of the rotor 10, and are arranged at equal intervals in a circumferential direction. The component 2 can be stored in the cavity 12 from a first main surface 10a side and can be projected toward a second main surface 10b side. That is, the attitude changing apparatus is configured such that the component 2 in a raised state where the component 2 is stored in the cavity 12 and has the end surface 2s thereof brought into contact with the reference surface 14a and the pair of side surfaces 2m, 2n thereof extending radially is rotated in a direction about a center axis which connects the pair of side surfaces 2m, 2n to each other while being held in the cavity 12 so that the component 2 is brought into a horizontal position where the side surface 2u is brought into contact with the reference surface 14a.

To be more specific, a length (a size in a radial direction) of the cavity 12 is expressed as L+α, and the length L+α is set larger than a length L, which is a length between the end surfaces 2s, 2t of the component 2. For example, α is set equal to or more than 0.1 mm (α≥0.1 mm). A width (a size in a circumferential direction) of the cavity 12 is set equal to or larger than a length T, which is a length between the pair of side surfaces 2m, 2n of the component 2.

As shown in FIG. 3 and FIG. 4, the engaging grooves 15 are formed on the reference surface 14a of the base 14 in a region corresponding to the cavities 12, and auxiliary suction grooves 14p, 14q are formed on a radially inner side of the engaging grooves 15. The engaging groove 15 extends in an approximately circumferential direction from one end 15a to the other end 15b.

Figure 7:
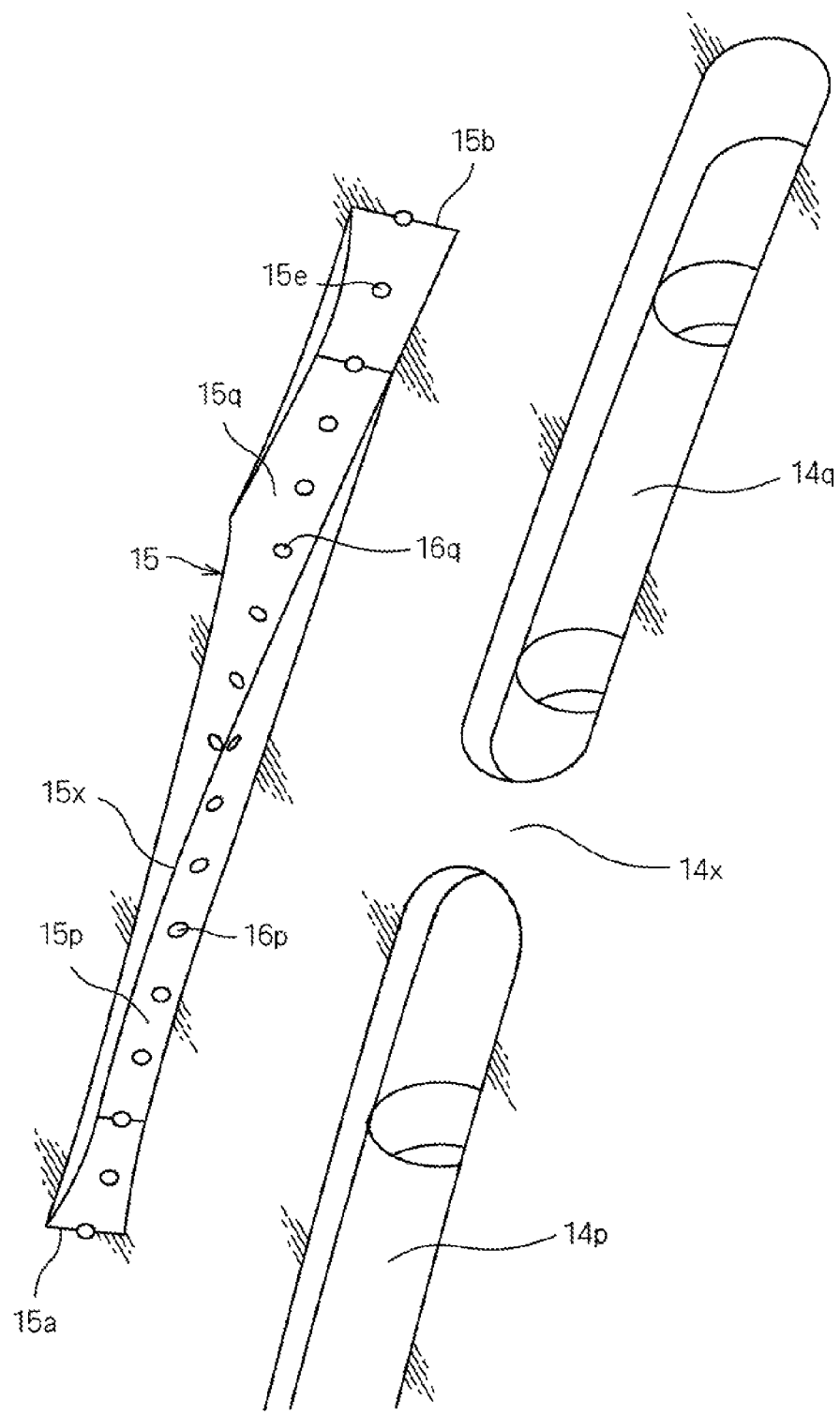
FIG. 7 is a perspective view of the base (embodiment 1).

FIG. 7 is a perspective view of a main part of the base 14. As shown in FIG. 7, the engaging groove 15 includes a first inclined surface 15p on a radially inner side and a second inclined surface 15q on a radially outer side with respect to a first groove bottom portion 15x in a linear shape which connects one end 15a and the other end 15b of the engaging groove 15 (hereinafter simply referred to as a "groove bottom portion 15x").

The first inclined surface 15p is inclined with respect to a direction which is orthogonal to a direction along which one end 15a and the other end 15b of the engaging groove 15 are connected to each other and intersects with the bottom groove portion 15x. The end surface 2s of the component 2 can contact with the first inclined surface 15p between the first zone S1 and one end 15a side of the second zone S2 of the engaging groove 15, that is, between one end 15a of the engaging groove 15 and the predetermined position. A width of the first inclined surface 15p is smaller than a longitudinal size (distance between end surfaces 2t, 2s) of the side surface 2u of the component 2 so that only the component 2 in a vertical position is fitted into the engaging groove 15 and is brought into contact with the first inclined surface 15p. First suction openings 16p which are connected to a pressure reduction source are formed in the first inclined surface 15p, and are configured to suck and hold the end surface 2s of the component 2 to the first inclined surface 15p between one end 15a and the predetermined position of the engaging groove 15. The first inclined surface 15p is formed such that, in the second zone S2 of the engaging groove 15, the inclination of the end surface 2s sucked and held to the first inclined surface 15p with respect to the reference surface 14a is gradually increased as the first inclined surface 15p extends toward the other end 15b side.

In this embodiment, the case is exemplified where the first inclined surface 15p is formed such that the inclination of the end surface of the component with respect to the reference surface is gradually increased along with the conveyance of the component in the conveyance direction. However, a portion where the inclination becomes small (reverse rotation) may be formed in the midst in the conveyance direction.

That is, it is sufficient that the first inclined surface 15p is formed in at least a partial region between the first end (one end 15a) of the first engaging groove 15 and the first predetermine position, in the direction toward the second end (the other end 15*b*) from the first end of the first engaging groove, the inclination of the first inclined surface 15*p* with respect to the reference surface 14*a* in a first orthogonal cross section orthogonal to the first groove bottom portion 15*x* is increased. Along with the conveyance of the component 2 along the first engaging groove 15*x* along with the relative movement of the conveyance member 10 with respect to the base 14 while the end surface 2*s* of the component 2 stored in the cavity 12 is sucked and held to the first inclined surface 15*p*, the inclination of the end surface 2*s* of the component 2 with respect to the reference surface 14*a* is increased and, at the same time, the inclination of the pair of side surfaces 2*u*, 2*v* of the component 2 with respect to the reference surface 14*a* are decreased. This embodiment exemplifies one preferred mode where the inclination of the first inclined surface 15*p* with respect to the reference surface 14*a* in the first orthogonal cross section is gradually increased as the first engaging groove 15 extends toward the second end 15*b* from the first end 15*a*.

The second inclined surface 15*q* intersects with the groove bottom portion 15*x* in a state where the second inclined surface 15*q* inclines to face the first inclined surface 15*p*. The side surface 2*u* of the component 2 can contact with the second inclined surface 15*q* between the other end 15*b* of the second zone S2 of the engaging groove 15 and the third zone S3 of the engaging groove 15, that is, between the predetermined position of the engaging groove 15 and the other end 15*b* of the engaging groove 15. Second suction openings 16*q* which are connected to a pressure reduction source are formed in the second inclined surface 15*q*, and are configured to suck and hold the side surface 2*u* of the component 2 to the second inclined surface 15*q* between the predetermined position of the engaging groove 15 and the other end 15*b* of the engaging groove 15. The second inclined surface 15*q* is formed such that, in the second zone S2 of the engaging groove 15, the inclination of the side surface 2*u* sucked and held to the second inclined surface 15*q* with respect to the reference surface 14*a* is gradually decreased as the second inclined surface 15*q* extends toward the other end 15*b* side.

The second inclined surface 15*q* may not be formed such that the component 2 can be sucked and held. It is sufficient that the second inclined surface 15*q* is configured such that, in at least a partial region between the first predetermined position and the second end of the engaging groove, the second inclined surface 15*q* moves the side surface of the component to the reference surface along with the conveyance of the component while supporting the side surface of the component which is stored in the cavity and is being conveyed, and the side surface of the component is brought into contact with the reference surface when the component passes the second end of the first engaging groove.

A depth of the engaging groove 15 is selected such that the component 2 which is sucked and held to the first and second inclined surfaces 15*p*, 15*q* of the engaging groove 15 is stored in the cavity 12 in a state where a portion of the component 2 projects from the reference surface 14*a*, and the component 2 is moved along the engaging groove 15 along with the rotation of the rotor 10 relative to the base 14.

As a material for the reference surface 14*a* of the base 14, metal, a resin, glass, ceramics such as zirconia or the like can be selectively used.

As shown in FIG. 3 and FIG. 4, on the second main surface 10*b* of the rotor 10, as an auxiliary suction unit, auxiliary suction holes 13 which communicate with end portions of the cavities 12 on a radially inner side are formed. End portions 13*s* of the auxiliary suction holes 13 on the radially inner side communicate with auxiliary suction grooves 14*p*, 14*q* formed on the reference surface 14*a* of the base 14 along with the rotation of the rotor 10. The auxiliary suction grooves 14*p*, 14*q* are connected to a pressure reduction source, and air is sucked in directions indicated by arrows 13*x*, 13*y* in FIG. 3. With such a configuration, the component 2 stored in the cavity 12 is sucked toward a radially inner side end of the cavity 12.

As shown in FIG. 4 and FIG. 7, a suction interrupting portion 14*x* is interposed between the auxiliary suction grooves 14*p*, 14*q*. Since the suction interrupting portion 14*x* interrupts the communication between the auxiliary suction holes 13 and the auxiliary suction grooves 14*p*, 14*q*, in the fourth zone S4, the suction applied to the component 2 in the cavity 12 radially inward is temporarily stopped.

Next, the operation of the component 2 in the attitude changing apparatus according to the embodiment 1 is described with reference to FIGS. 5(*a*)-5(*d*) and FIGS. 6(*a*)-5(*c*). FIGS. 5(*a*)-5(*d*) and FIGS. 6(*a*)-6(*c*) are cross-sectional views of a main part of the attitude changing apparatus schematically showing the attitude change of the component 2 along with the rotation of the rotor 10.

As shown in FIG. 5(*a*), the component 2 is supplied to the cavity 12 by the component supply unit. In the attitude changing apparatus, the component supply unit supplies the components 2 into the cavity in a state where the directions of the components 2 are aligned and hence, in all of the components 2 supplied to the cavities 12 by the component supply unit, the end surfaces 2*s* are brought into contact with the reference surface 14*a*.

When the component 2 reaches one end 15*a* of the engaging groove 15, as shown in FIG. 5(*b*), in the first zone S1 of the engaging groove 15, the end surface 2*s* of the component 2 is held on the first inclined surface 15*p* by suction indicated by an arrow 80, and the component 2 is moved along the first inclined surface 15*p* due to the rotation of the rotor 10 so that the component 2 is lowered from the reference surface 14*a*.

Next, in the second zone S2 of the engaging groove 15, as shown in FIG. 5(*c*), the first inclined surface 15*p* which sucks and holds the end surface 2*s* of the component 2 is inclined. As the component 2 is conveyed toward the other end 15*b* side of the engaging groove 15, the component 2 is rotated in a counterclockwise direction shown in FIG. 5(*c*) so that the inclination of the end surface 2*s* with respect to the reference surface 14*a* is gradually increased.

When the component 2 reaches a predetermined position, holding by suction of the end surface 2*s* to the first inclined surface 15*p* is released. When the component 2 passes the predetermined position, as shown in FIG. 5(*d*), the side surface 2*u* of the component 2 is held by the second inclined surface 15*q* by suction indicated by an arrow 82. At this stage of operation, the component 2 is rotated using a corner of the component 2 as a fulcrum of rotation on the groove bottom portion 15*x* of the engaging groove 15.

Not to interrupt the rotation of the component 2, in the fourth zone S4 in the vicinity of the predetermined position, the suction of the component 2 toward a radially inner side through the auxiliary suction hole 13 is temporarily stopped. That is, during a predetermined period where holding by suction of the component 2 by the first inclined surface 15*p* and holding by suction of the component 2 by the second inclined surface 15*q* are switched, a suction force from the auxiliary suction unit is not applied to the component 2. The fourth zone S4 in which the auxiliary suction is stopped may be disposed on a more one end 15a side than the predetermined position is.

When the component 2 passes the fourth zone S4, the suction of the component 2 through the auxiliary suction hole 13 is started again. The side surface 2u of the component 2 is sucked to and held on the second inclined surface 15q, the component 2 is moved along the second inclined surface 15q and, further, the component 2 is rotated in a counterclockwise direction in the drawing so that the component 2 is further inclined whereby the inclination of the side surface 2u with respect to the reference surface 14a is gradually decreased.

Figure 6A:
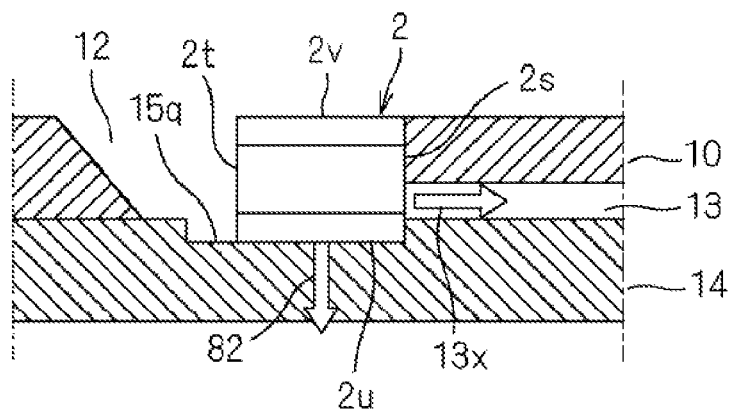
FIGS. 6(*a*)-6(*c*) are cross sectional views of the main component showing steps of changing an attitude (embodiment 1).
Figure 6B:
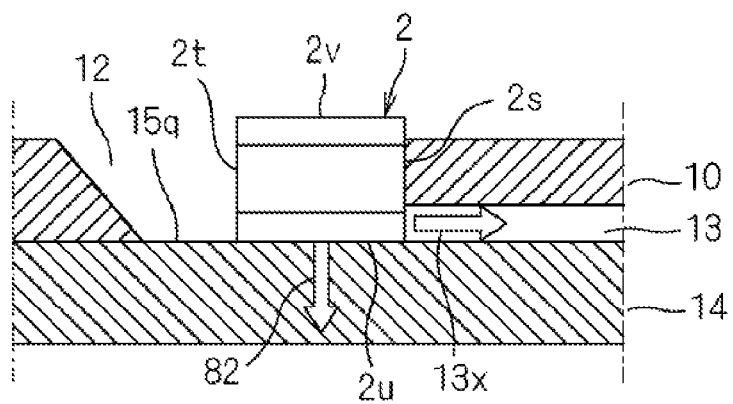
Figure 6C:
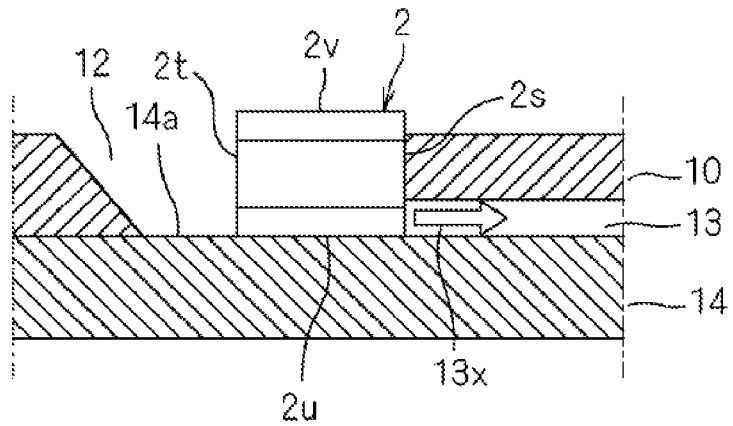

When the component 2 reaches the third zone S3 of the engaging groove 15, as shown in FIG. 6(a), the side surface 2u of the component 2 becomes parallel to the reference surface 14a. In the third zone S3 of the engaging groove 15, the side surface 2u of the component 2 is elevated to the height of the reference surface 14a as shown in FIG. 6(c) while maintaining the attitude where the side surface 2u is parallel to the reference surface 14a.

When the component 2 passes the other end 15b of the engaging groove 15, the suction to the side surface 2u indicated by the arrow 82 is finished. As shown in FIG. 6(c), the attitude of the component 2 is changed into the horizontal position where the side surface 2u is brought into contact with the reference surface 14a and the center line which connects the end surfaces 2s, 2t to each other becomes parallel to the reference surface 14a. Also during such an operation, the component 2 is pulled toward the radial inside of the cavity 12 by suction through the auxiliary suction hole 13.

As described above, with respect to the component 2 in an attitude where the center line which connects the end surfaces 2s, 2t to each other is perpendicular to the reference surface 14a, the attitude of the component 2 is changed into an attitude where the center line is parallel to the reference surface 14a by passing the engaging groove 15 along with the rotation of the rotor 10. The component 2 is rotated using a corner of the component as a fulcrum of rotation on the groove bottom portion 15x of the engaging groove 15 and hence, the disturbance of the position of the fulcrum of rotation are suppressed whereby the attitude of the component 2 can be changed with certainty. The configuration where the biasing member is brought into contact with the component 2 and biases the component 2 is not adopted and hence, the attitude of the component 2 can be changed without damaging the component 2.

Figure 5A:
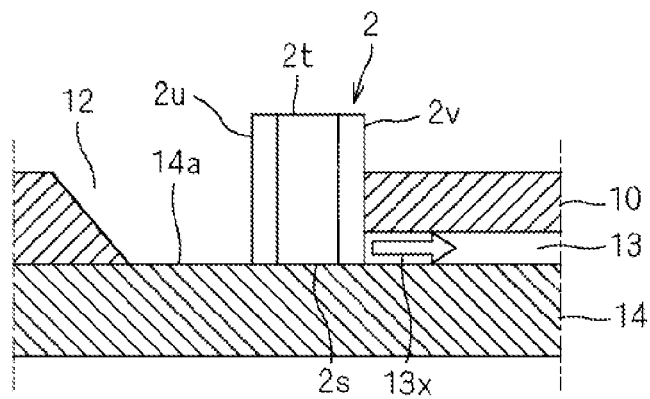
FIGS. 5(*a*)-5(*d*) are cross sectional views of the main component showing steps of changing an attitude (embodiment 1).
Figure 5B:
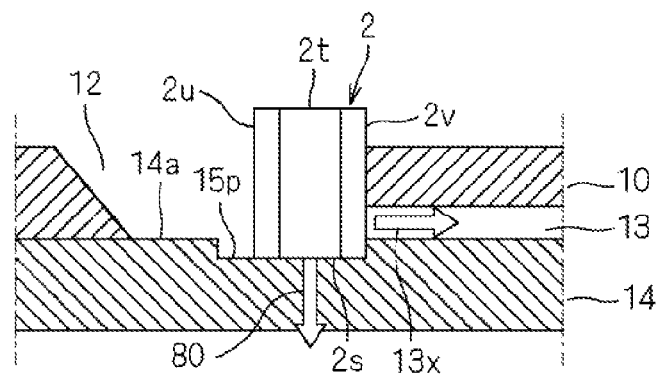
Figure 5C:
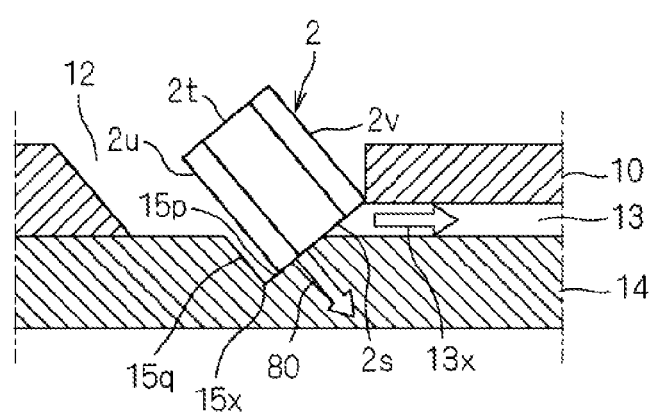
Figure 5D:
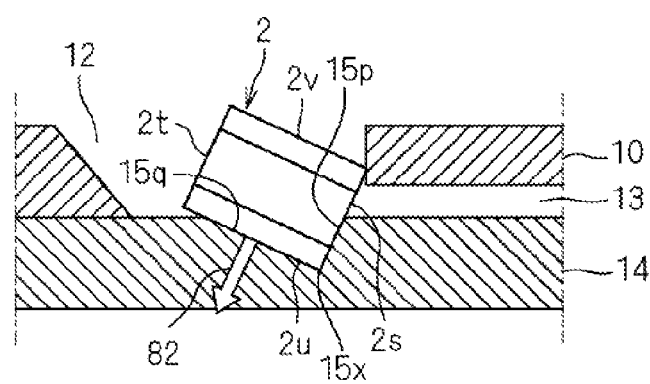

Due to suction through the auxiliary suction hole 13, as shown in FIGS. 5(a) to 5(c), first, a lower portion of the side surface 2v of the component 2 is sucked so that a suction force acts in a direction that the vertical position of the component 2 is held. Next, as shown in FIGS. 6(a) to 6(c), the end surface 2s of the component 2 is sucked radially inward and hence, the suction through the auxiliary suction hole 13 accelerates the changing of the attitude of the component 2 into the horizontal position.

Due to suction through the auxiliary suction holes 13, the components 2 are pulled to the radially inner side of the cavities 12 and hence, the positional displacement of the components 2 can be prevented whereby the attitude change of the components 2 can be performed in a stable manner. Since the falling or the positional displacement of the components 2 from the cavities 12 can be prevented due to the suction through the auxiliary suction holes 13, it is possible to arbitrarily select the direction of the reference surface 14a. For example, the reference surface 14a can be inclined from a horizontal plane or the reference surface 14a can be set in a vertical direction. When the reference surface 14a is disposed horizontally, suction through the auxiliary suction holes 13 may be omitted.

The attitude changing apparatus may be configured such that a component falls down radially inward in place of falling down radially outward. In this case, an auxiliary suction hole is formed in the rotor such that the component is sucked toward the radial outside of the cavity. Further, a portion of the engaging groove radially outside the groove bottom portion forms the first inclined surface and a portion of the engaging groove radially inside the groove bottom portion forms the second inclined surface.

Embodiment 2

In the embodiment 2, an attitude changing apparatus having substantially the same configuration as the attitude changing apparatus of the embodiment 1 is adopted.

Unlike the embodiment 1, in the embodiment 2, a component supply unit supplies components into the cavities by aligning the directions of the components such that side surfaces of the components are brought into contact with a reference surface. A rotor is rotated in the same direction as the rotor in the embodiment 1. With such a configuration, with respect to the component stored in the cavity, the side surface of the component is sucked to and held on a first inclined surface from one end to a predetermined position of an engaging groove, and the side surface is inclined along with the conveyance of the component to the predetermined position from one end. After the component passes the predetermined position, an end surface disposed adjacently to a side of the side surface approaches closest to a groove bottom portion when the side surface is sucked to and held on the first inclined surface is sucked to and held on a second inclined surface so that the side surface is further inclined. When the component passes the engaging groove, the attitude of the component is changed into a vertical position where a center axis which connects end surfaces to each other is perpendicular to the reference surface from a horizontal position where the center axis is parallel to the reference surface.

In this case, it is preferable that a width of one end of the engaging groove be larger than a length between the end surfaces of the component such that the component which is brought into contact with the reference surface enters one end of the engaging groove from a side surface side of the component with certainly.

Embodiment 3

An aligning apparatus according to the embodiment 3 has substantially the same configuration as the aligning apparatus of the embodiment 1. The aligning apparatus of the embodiment 3 differs from the aligning apparatus of the embodiment 1 with respect to a point that a component supply unit supplies components to cavities without aligning the directions of the components. The components supplied to the cavities by the component supply unit are the components in a vertical position and the components in a horizontal position.

A width of one end of the engaging groove is set larger than a length between the side surfaces of the component such that the component in a vertical position having an end surface thereof brought into contact with the reference surface can enter the engaging groove from one end of the engaging groove with certainly, and the width of one end of the engaging groove is set smaller than a length between end surfaces of the component such that the component in a horizontal position having side surfaces thereof brought into contact with the reference surface do not enter the engaging groove from one end of the engaging groove.

In the aligning apparatus of the embodiment 3, a rotor is rotated in the same direction as the rotor in the embodiment 1. A component in a vertical position supplied to the cavity by the component supply unit has an attitude thereof changed into a horizontal position by passing the engaging groove. On the other hand, a component in a horizontal position supplied to the cavity by the component supply unit is moved to at least a predetermined position without being brought into contact with a first inclined surface of the engaging groove, and is to have the horizontal position even after the component passes the engaging groove.

That is, the attitude changing apparatus of the embodiment 3 changes the attitude of the component from a vertical position to a horizontal position only with respect to the component in a vertical position when the component is supplied to the cavity by the component supply unit.

Embodiment 4

In an aligning apparatus of the embodiment 4, to a first region where a component supplied in a vertical position is changed into a horizontal position when the component passes the engaging groove, as a next region, a second region where the component in a horizontal position is changed into a vertical position when the component passes the engaging groove is connected. The first region has substantially the same configuration as the first region in the embodiment 3, and the second region has substantially the same configuration as the second region in the embodiment 2.

The component supply unit of the aligning apparatus of the embodiment 4 supplies components to cavities on an upstream side of the first region without aligning the directions of the components. Although the components supplied to the cavities by the component supply unit are the components in a vertical position and the components in a horizontal position, after the components pass the first region, all components are to have a horizontal position. Next, when the component passes a second engaging groove in a second region, all components are to have a vertical position.

That is, the second engaging groove includes: a second groove bottom portion in a linear shape which connects the third end and the fourth end of the second engaging groove to each other; a third inclined surface which is disposed adjacently to the second groove bottom portion and extends toward one side of the second groove bottom portion; and a fourth inclined surface which is disposed adjacently to the second groove bottom portion and extends toward the other side of the second groove bottom portion. Out of the third inclined surface and the fourth inclined surface, at least the third inclined surface is configured to suck and hold the component. The conveyance member moves relative to the base such that the cavity moves in a facing manner with the second engaging groove from the third end to the fourth end of the second engaging groove. The third inclined surface is configured such that the inclination of the third inclined surface with respect to the reference surface in a second orthogonal cross section orthogonal to the second groove bottom portion is increased toward the fourth end from the third end of the second engaging groove in at least a portion of a region from the third end to a second predetermined position of the second engaging groove, and the inclination of the side surface of the component with respect to the reference surface is increased and, at the same time, the inclination of the end surface of the component with respect to the reference surface is decreased along with the conveyance of the component from the third end to the fourth end of the second engaging groove along the second engaging groove due to relative movement of the conveyance member with respect to the base such that the side surface of the component stored in the cavity is sucked to and held on the third inclined surface. The fourth inclined surface is formed such that the fourth inclined surface is brought into contact with the end surface of the component which is stored in the cavity and is conveyed, the end surface of the component is moved to the reference surface along with the conveyance of the component in at least a partial region of the engaging groove from the second predetermined position to the fourth end, and the end surface of the component is brought into contact with the reference surface when the component passes the fourth end of the second engaging groove.

With respect to the second region, when a component in a vertical position passes the second region, there is a possibility that the attitude of the component is changed into a horizontal position. In view of the above, the attitude of a component to be supplied to the second region is made to have a horizontal position in the first region in advance. With such a configuration, after the components pass the second region, all components are to have a vertical position.

Next, modifications 1 to 4 are described with reference to FIG. 8 to FIG. 11.

Modification 1

Figure 8:
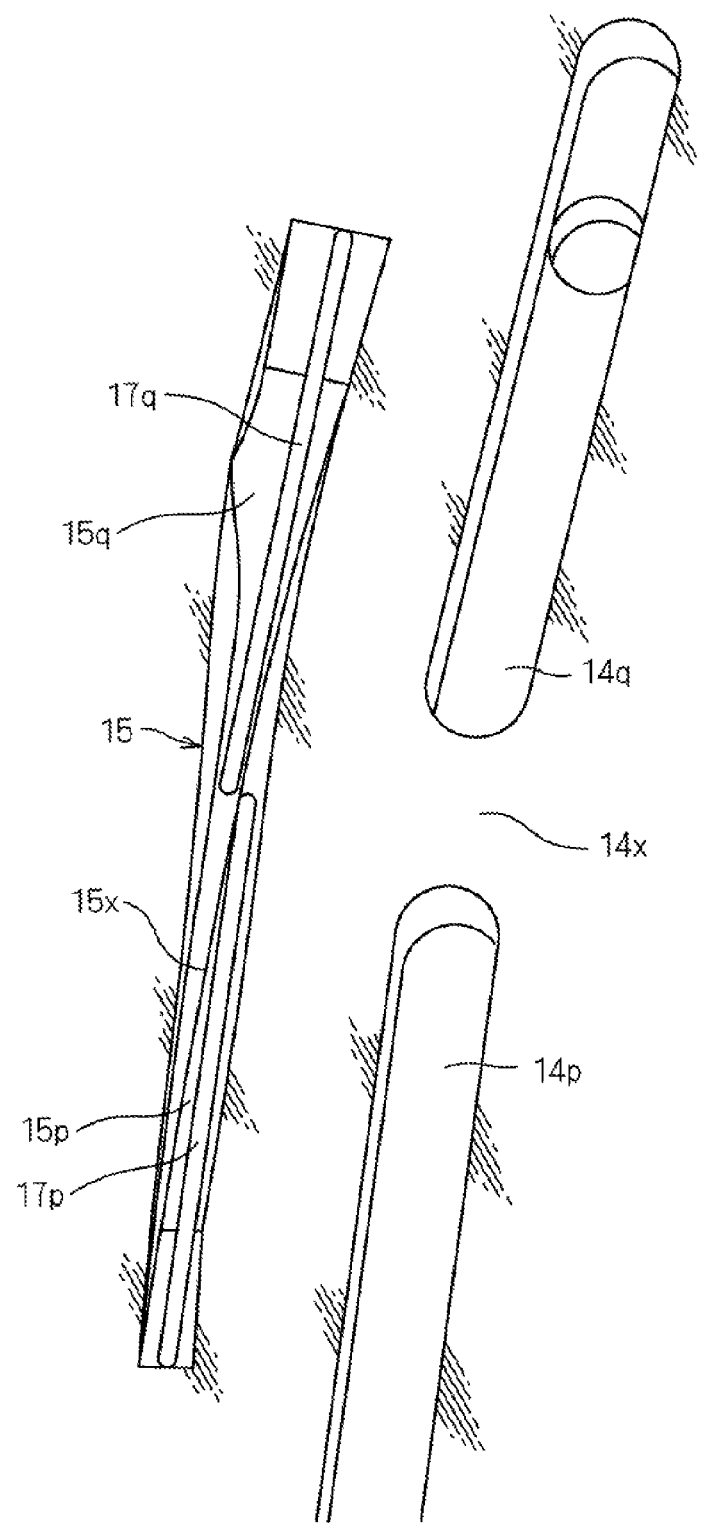
FIG. 8 is a perspective view of the base (modification 1).

FIG. 8 is a perspective view of a main part of a base according to the modification 1. As shown in FIG. 8, in place of forming the first and second suction openings in first and second inclined surfaces 15p, 15q of the engaging groove 15 intermittently, first and second suction openings 17p, 17q which are continuously formed in a direction from one end 15a to the other end 15b are formed.

Modification 2

FIGS. 9(a) and 9(b) are plan views showing the schematic configurations of rotors 50, 60 according to a modification 2. The rotor 50 shown in FIG. 9(a) has cavities 52 formed in a notched shape along an outer periphery of the rotor 50. The cavities 52 penetrate between main surfaces of the rotor 50, the main surfaces being opposite to each other. The rotor 60 shown in FIG. 9(b) has cavities 62 formed at equal angular intervals concentrically in plural concentric circles. In FIGS. 9(a) and 9(b), only some cavities 52 and some cavities 62 are shown.

Modification 3

FIG. 10 is a schematic view showing the schematic configuration of an endless belt 70 according to a modification 3. As shown in FIG. 10, the endless belt 70 on which cavities 74 are formed is used as a conveyance member, and the endless belt 70 is configured such that an attitude of a component 2 stored in the cavity 74 is changed when the component 2 is conveyed in a straight-line direction or a circumferential direction. As a material for the endless belt 70, a resin, metal or the like can be used. A base 76 can be disposed inside or outside the endless belt 70. In FIG. 10, only some cavities 74 are shown. The cavities may be formed in a notched shape along an outer periphery of the endless belt 70.

Modification 4

FIG. 11 is a schematic view showing the schematic configuration of a rotary drum 80 according to a modification 4. As shown in FIG. 11, the circular cylindrical rotary drum 80 on which cavities 82 are formed is used as a conveyance member, and a base (not shown in the drawing) is disposed inside or outside of the rotary drum 80. The rotary drum 80 is configured such that an attitude of a component 2 stored in the cavity 82 is changed when the component 2 is conveyed in a circumferential direction. As a material for the rotary drum 80, a resin, metal, glass, ceramics such as zirconia or the like can be used. In FIG. 11, only some cavities 82 are shown.

Embodiment 5

An attitude changing apparatus of an embodiment 5 is described with reference to FIG. 12. The attitude changing apparatus of the embodiment 3 is configured substantially in the same manner as the attitude changing apparatus of the embodiment 1. The operation of the attitude changing apparatus of the embodiment 3 is equal to the operation of the attitude changing apparatus of the embodiment 1. Hereinafter, constitutional elements equal to the constitutional elements of the attitude changing apparatus of the embodiment 1 are given the same symbols, and the description is made mainly with respect to a point which makes the attitude changing apparatus of this embodiment different from the attitude changing apparatus of the embodiment 1.

Figure 12:
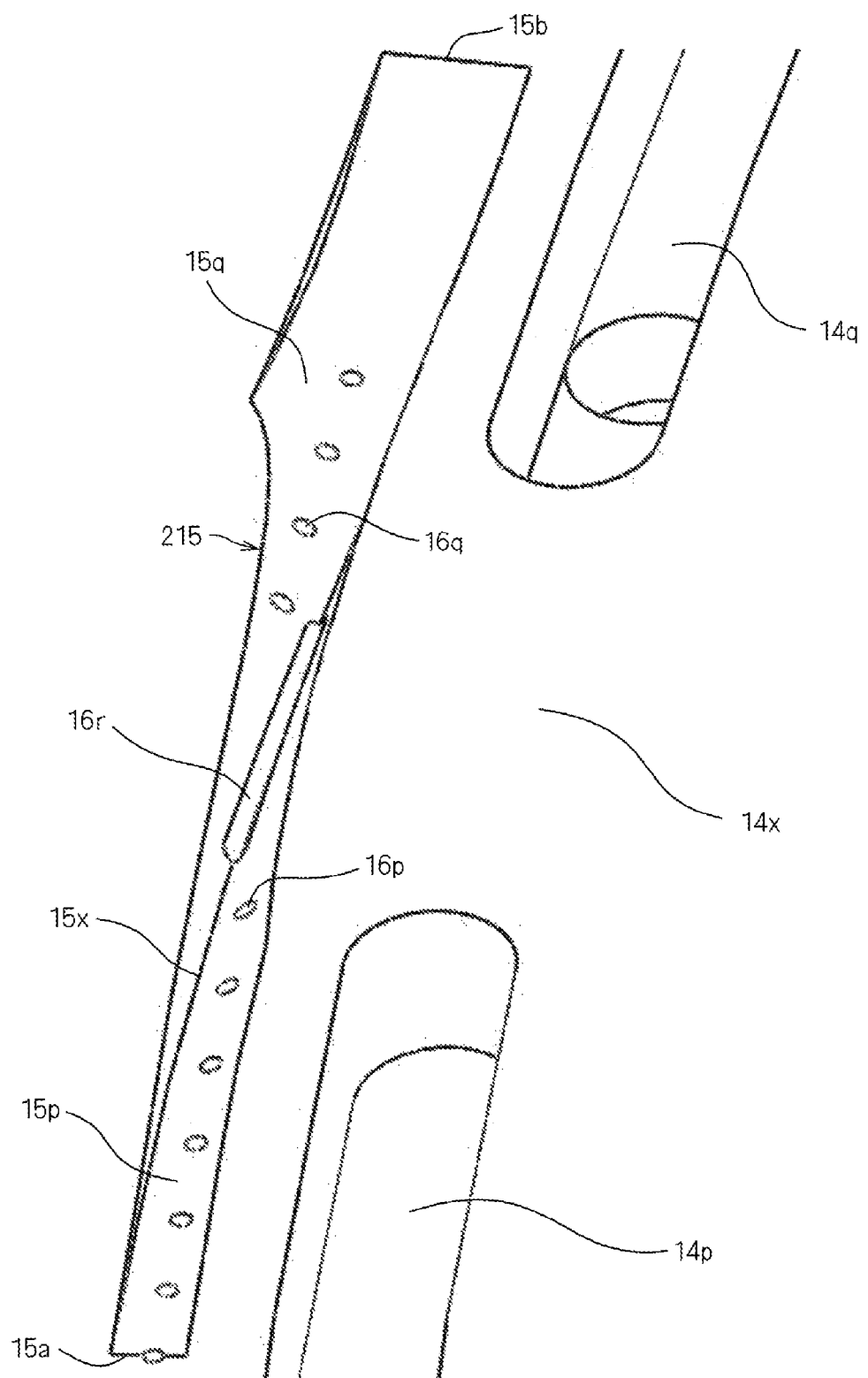
FIG. 12 is a perspective view of a main component of a base (embodiment 5).

FIG. 12 is a perspective view of a main part of a base. As shown in FIG. 12, in the same manner as the attitude changing apparatus of the embodiment 1, an engaging groove 215 includes first and second inclined surfaces 15$p$, 15$q$ which intersect with a groove bottom portion 15$x$. In the same manner as the embodiment 1, first and second suction openings 16$p$, 16$q$ which are connected to a pressure reduction source are formed in the first and second inclined surfaces 15$p$, 15$q$ respectively.

Unlike the embodiment 1, a third suction opening 16$r$ is formed in the engaging groove 215. The third suction opening 16$r$ is formed in the groove bottom portion 15$x$ and the first and second inclined surfaces 15$p$, 15$q$ such that the third suction opening 16$r$ straddles over a predetermined position at which the suction and holding of a component is switched from the first inclined surface 15$p$ to the second inclined surface 15$q$, that is, the third suction opening 16$r$ overlaps with the groove bottom portion 15$x$ within a region between one end 15$a$ side of the engaging groove 215 with respect to the predetermined position and the other end 15$b$ side of the engaging groove 215 with respect to the predetermined position. That is, the third suction opening 16$r$ is formed at the predetermined position or in a region in the vicinity of the predetermined position such that the third suction opening 16$r$ overlaps with the first inclined surface 15$p$, the groove bottom portion 15$x$, and the second inclined surface 15$q$.

In the case where a component is conveyed while being sucked to and held by the first inclined surface 15$p$ or the second inclined surface 15$q$, when the disturbance of the attitude of the component occurs, for example, the entrance of a corner of the component into the first suction opening 16$p$ or the second suction opening 16$q$ occurs, there is a possibility that a defect such as flaws or cracks occurs in the component. Particularly, as shown in FIG. 7, when the first and second suction openings 16$p$, 16$q$ are disposed close to the groove bottom portion 15$x$ at the predetermined position at which the suction and holding of the component is switched and in a region in the vicinity of the predetermined position, due to the slight disturbance of the attitude of the component, the corner of the component is liable to enter the first suction opening 16$p$ or the second suction opening 16$q$.

In view of the above, by providing the third suction opening 16$r$ at the predetermined position where the suction and holding of the component is switched and in a region in the vicinity of the predetermined position, the corner of the component is sucked to and held by suction from the third suction opening 16$r$, thus stabilizing the attitude of the component. With such an operation, the corner of the component minimally enters the first suction opening 16$p$ or the second suction opening 16$q$. As a result, it is possible to suppress the occurrence of a defect such as flaws or cracks on the component at the time of changing an attitude of the component.

Embodiment 6

Figure 13:
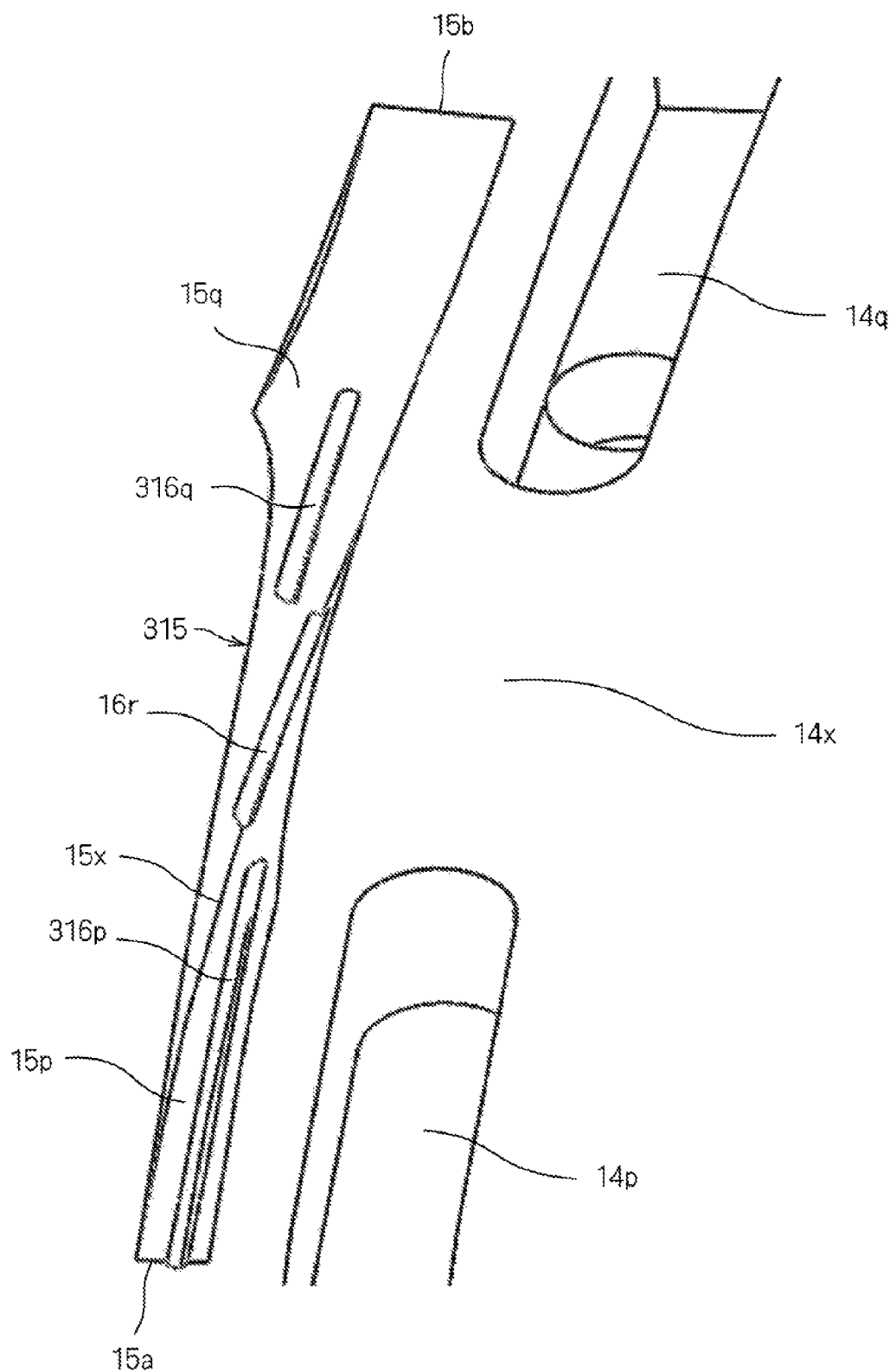
FIG. 13 is a perspective view of a main component of a base (embodiment 6).

An attitude changing apparatus of an embodiment 6 is described with reference to FIG. 13. FIG. 13 is a perspective view of a main part of a base.

As shown in FIG. 13, the attitude changing apparatus of the embodiment 6 differs from the attitude changing apparatus of the embodiment 3 with respect to a configuration of a first suction opening 316$p$ formed in a first inclined surface 15$p$ and a configuration of a second suction opening 316$q$ formed in a second inclined surface 15$q$. Other configurations and the operation of the attitude changing apparatus of the embodiment 6 are equal to those of the attitude changing apparatus of the embodiment 3.

That is, the first and second suction openings 316$p$, 316$q$ are formed in a continuously elongated manner in a direction that one end 15$a$ and the other end 15$b$ of an engaging groove 315 are connected to each other. A component is conveyed along the engaging groove 315 and hence, the suction and holding of the component by the first suction opening 316$p$ and the suction and holding of the component by the second suction opening 316$q$ are continuously performed. When the suction and holding of the component by the first suction opening 316$p$ and the suction and holding of the component by the second suction opening 316$q$ are continuously performed, an attitude of the component is minimally disturbed compared to a case where the component is sucked and held intermittently. Accordingly, it is possible to further suppress the occurrence of a defect such as flaws or cracks on the component more effectively.

Embodiment 7

An attitude changing apparatus of an embodiment 7 is described with reference to FIGS. 14($a$)-14($c$) and FIGS. 15($a$)-5($c$). In the attitude changing apparatus of the embodiment 7, out of a first inclined surface 15$p$ and a second inclined surface 15$q$, only the first inclined surface 15$p$ of an engaging groove 15 is used for sucking and holding the component 2 as well as for changing the attitude of the component 2.

Figure 14A:
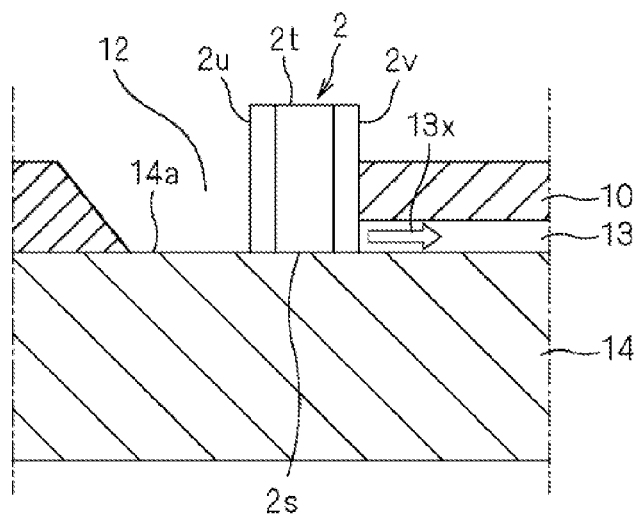
FIGS. 14(*a*)-14(*c*) are cross-sectional views of a main component orthogonal to a groove bottom portion of an engaging groove (embodiment 7).
Figure 14B:
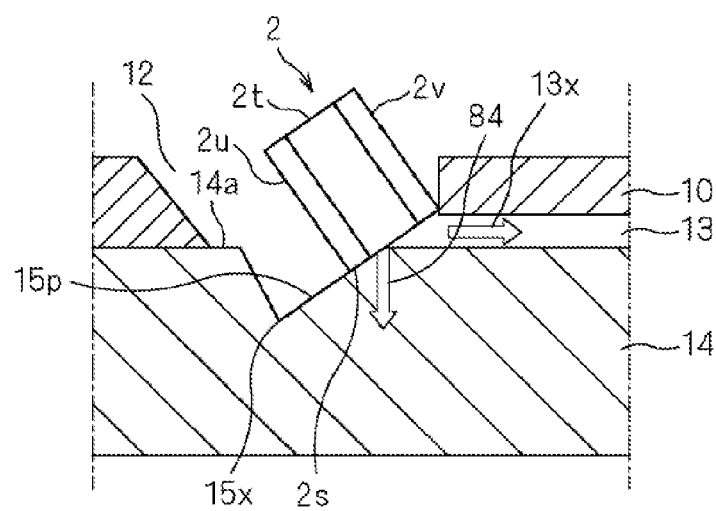
Figure 14C:
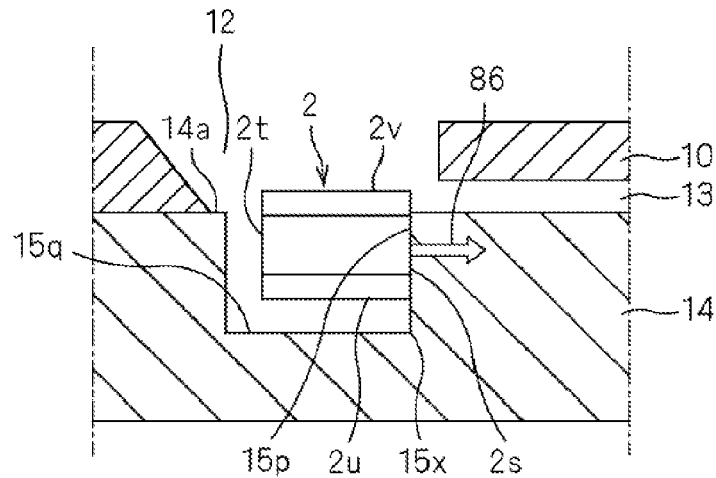
Figure 15A:
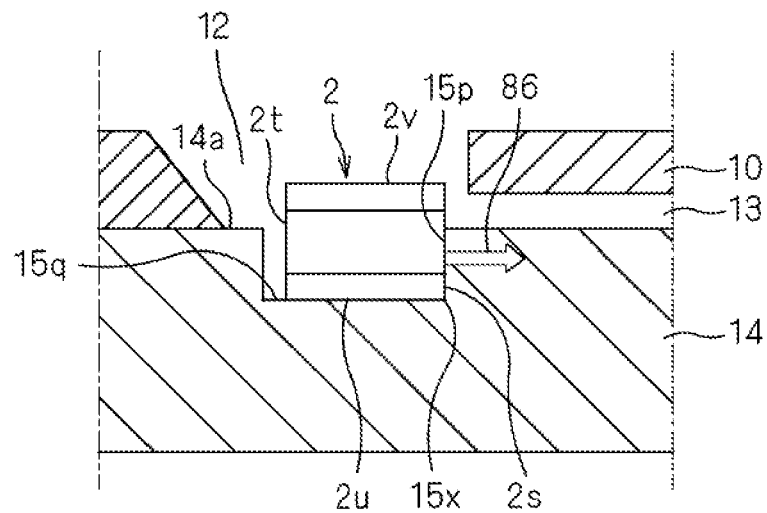
FIGS. 15(*a*)-15(*c*) are cross-sectional views of the main component orthogonal to the groove bottom portion of the engaging groove (embodiment 7).
Figure 15B:
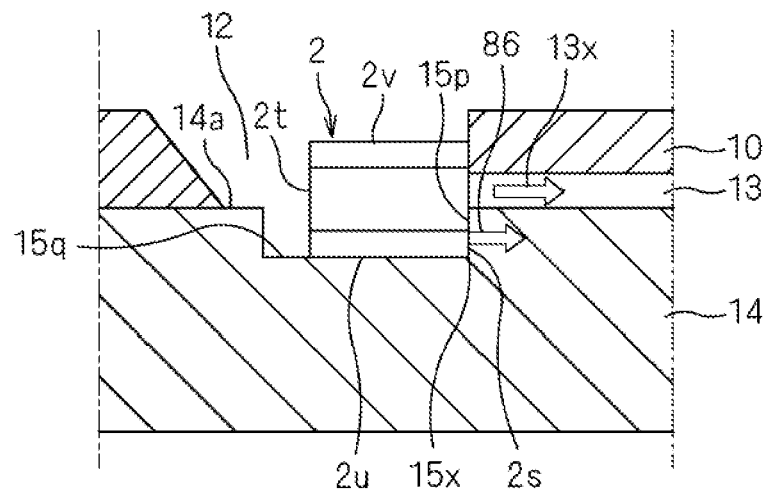
Figure 15C:
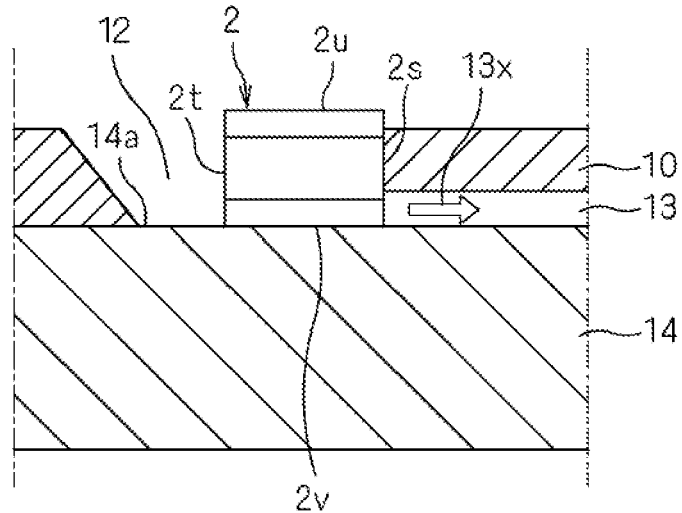

FIG. 14($a$) to FIG. 15($c$) are cross-sectional views of a main part orthogonal to a groove bottom portion 15$x$ of the engaging groove 15. FIG. 14($a$) is a cross-sectional view of the main part of the engaging groove 15 at one end 15$a$, and FIG. 15($c$) is a cross-sectional view of the main part of the engaging groove 15 at the other end 15$b$. FIG. 14($a$) to FIG. 15($c$) show portions of the engaging groove 15 ranging from one end 15$a$ to the other end 15$b$ sequentially.

As shown in FIGS. 14($a$)-14($c$) and FIGS. 15($a$)-5($c$), the engaging groove 15 is formed in a groove shape on a reference surface 14$a$ of a base 14. The engaging groove 15 includes the groove bottom portion 15$x$ in a linear shape which connects one end 15$a$ and the other end 15$b$ of the engaging groove 15 to each other, and a first inclined surface 15p and a second inclined surface 15q which are disposed adjacently to both sides of the groove bottom portion 15x respectively. The first inclined surface 15p is formed such that the inclination of the first inclined surface 15p with respect to the reference surface 14a is gradually increased from one end 15a to a predetermined position of the engaging groove 15, and the first inclined surface 15p remains perpendicular to the reference surface 14a from the predetermined position to the other end 15b of the engaging groove 15. The second inclined surface 15q is formed such that a distance between the second inclined surface 15q and the reference surface 14a is gradually decreased as the second inclined surface 15q extends from the predetermined position to the other end 15b of the engaging groove 15. The second inclined surface 15q is formed such that the inclination of the second inclined surface 15q with respect to the reference surface 14a is gradually increased from one end to the predetermined position of the engaging groove 15, and the second inclined surface 15q remains parallel to the reference surface 14a from the predetermined position to the other end 15b of the engaging groove 15.

The attitude changing apparatus of the embodiment 7 is configured such that, out of the first inclined surface 15p and the second inclined surface 15q, only the first inclined surface 15p can suck and hold the component 2 as indicated by arrows 84, 86.

The attitude changing apparatus of the embodiment 7 includes substantially the same auxiliary suction unit as the embodiment 1, wherein the component 2 stored in a cavity 12 formed in a conveyance member 10 is sucked in a direction indicated by an arrow 13x through an auxiliary suction hole 13 formed in the conveyance member 10.

Next, the operation of the attitude changing apparatus of the embodiment 7 is described. The component 2 is stored in the cavity 12 such that the component 2 assumes an attitude where an end surface 2s of the component 2 is brought into contact with the reference surface 14a of the base 14. The conveyance member 10 is moved relative to the base 14 such that the cavity 12 faces the engaging groove 15 from one end 15a to the other end 15b of the engaging groove 15. At this stage of operation, the component 2 stored in the cavity 12 is moved along the engaging groove 15 while being held in a state where the component 2 is stored in the cavity 12 so that the attitude of the component 2 is changed.

To be more specific, as shown in FIG. 14(a), the component 2 stored in the cavity 12 is sucked in the direction indicated by the arrow 13x through the auxiliary suction hole 13 so that the component 2 is brought into a state where the component 2 is disposed close to one side of the cavity 12, and is conveyed to one end 15a of the engaging groove 15.

Subsequently, as indicated by an arrow 84 in FIG. 14(b), the component 2 is conveyed while the end surface 2s of the component 2 is sucked to and held by the first inclined surface 15p of the engaging groove 15, and is gradually inclined. Further, the component 2 is rotated by 90° as shown in FIG. 14(c).

Next, as shown in FIG. 15(a), the second inclined surface 15q which is disposed parallel to the reference surface 14a is brought into contact with a side surface 2u of the component 2. Along with the conveyance of the component 2, the component 2 is elevated to the reference surface 14a. When the component 2 passes the other end 15b of the engaging groove 15, the side surface 2u of the component 2 is brought into contact with the reference surface 14a.

When the component 2 stored in the cavity 12 is sucked in the direction indicated by the arrow 13x through the auxiliary suction hole 13, the positional displacement of the component 2 at the time of conveying the component 2 can be prevented thus stabilizing the conveyance of the component and the attitude changing operation. However, when a suction force of the auxiliary suction unit is excessively large at the time of changing an attitude of the component 2, there may be a case where the attitude changing operation for the component 2 is not stabilized. Accordingly, it is preferable that a suction force of the auxiliary suction unit be set smaller than a force for sucking and holding the component 2 generated by the first inclined surface 15p and/or the second inclined surface 15q in an area in the vicinity of the predetermined position at which the component 2 starts to make contact with the second inclined surface 15q. For example, as shown in FIG. 14(c) and FIG. 15(a) where the arrow 13x is not illustrated, in the region in the vicinity of the predetermined position where the component 2 starts to make contact with the second inclined surface 15q, the auxiliary suction unit stops the suction of the component 2 through the auxiliary suction hole 13 or weakens suction of the component 2 through the auxiliary suction hole 13.

Embodiment 8

An embodiment 8 is described with reference to FIGS. 16(a) and 16(b) and FIGS. 17(a) and 17(b). FIGS. 16(a) and 16(b) and FIGS. 17(a) and 17(b) are explanatory views showing imaginary planes 3p, 3q respectively.

Figure 16A:
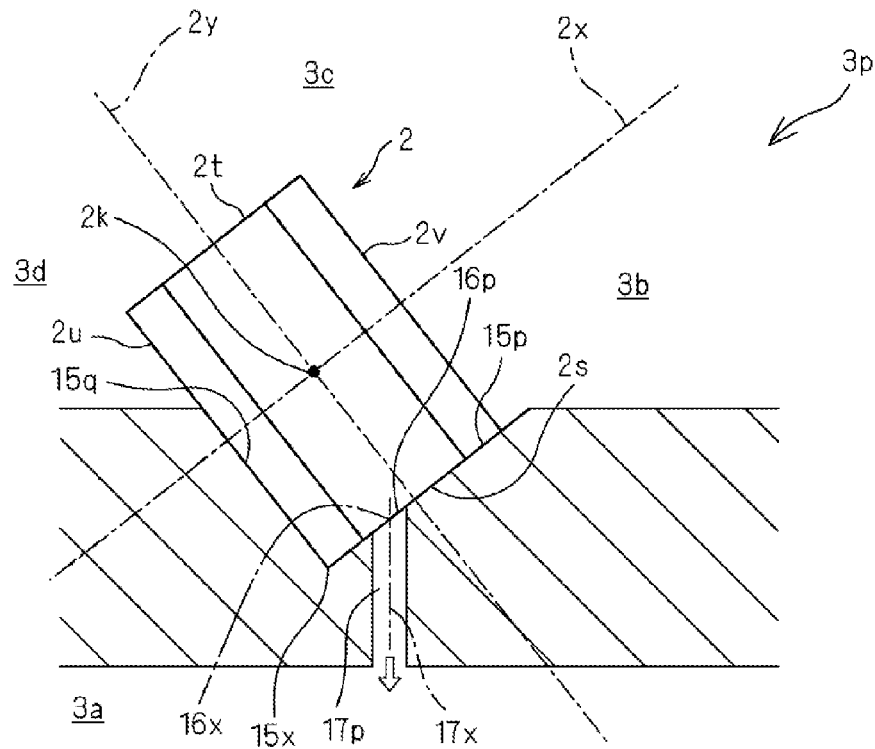
FIGS. 16(*a*) and 16(*b*) are explanatory views showing an imaginary plane (embodiment 8).
Figure 16B:
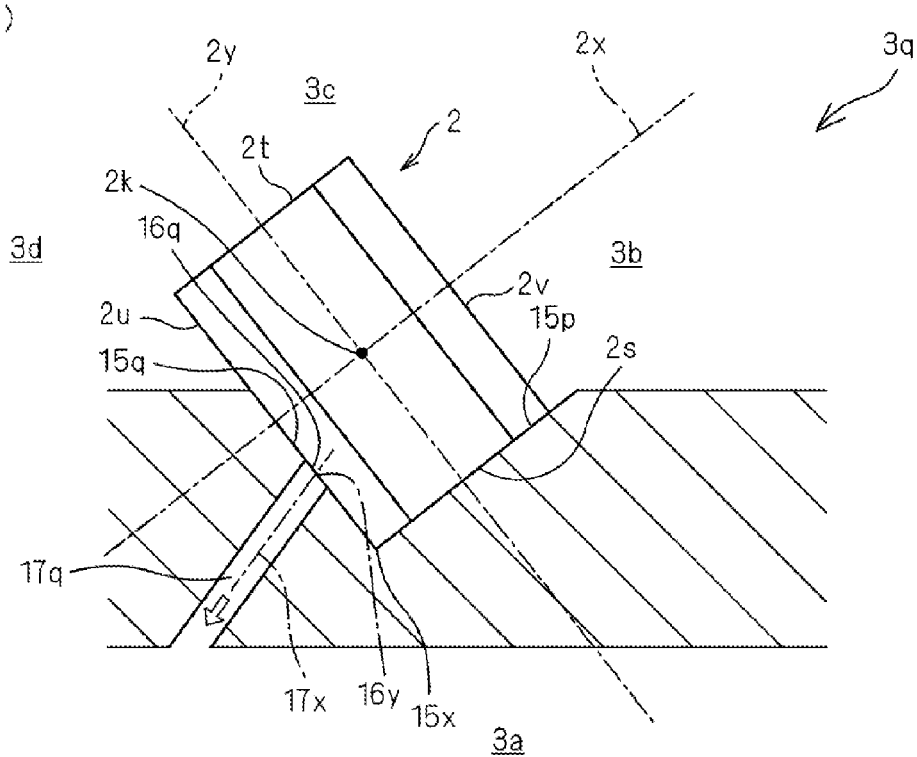

As shown in FIG. 16(a) and FIG. 16(b), an opening center 16x of the suction opening 16p formed in the first inclined surface 15p of the engaging groove 15 and an opening center 16y of the suction opening 16q formed in the second inclined surface 15q of the engaging groove 15 are disposed within a region 3a including the groove bottom portion 15x out of four regions 3a to 3d which are defined by a first plane 2x and a second plane 2y or on a boundary line of the region 3a.

FIG. 16(a) shows the imaginary plane 3p which passes the opening center 16x on the first inclined surface 15p of one suction opening 16p formed in the first inclined surface 15p and is orthogonal to the groove bottom portion 15x. The component 2 is disposed in the engaging groove 15 such that the center of gravity 2k of the component 2 is included in the imaginary plane 3p, the component 2 is brought into contact with the first inclined surface 15p, and a corner of the component 2 approaches closest to the groove bottom portion 15x. Here, depending on a shape of the engaging groove 15, a gap is formed between the first inclined surface 15p and the component 2 or between the second inclined surface 15q and the component 2.

As shown in FIG. 16(a), the position of the opening center 16x of one suction opening 16p formed in the first inclined surface 15p is disposed within the region 3a including the groove bottom portion 15x, out of four regions 3a to 3d which are formed by dividing the imaginary plane 3p by a first plane 2x which is parallel to an end surface 2s of the component 2 facing the first inclined surface 15p and passes the center of gravity 2k of the component 2 and a second plane 2y which is parallel to the side surface 2u of the component 2 facing the second inclined surface 15q and passes the center of gravity 2k of the component 2, or on the boundary line of the region 3a. In this case, there is a tendency that the component 2 is sucked such that the second plane 2y which passes the center of gravity 2k of the component 2 approaches the opening center 16x of the suction opening 16 formed in the first inclined surface 15p and hence, the component 2 is sucked and held such that a state where the corner of the component 2 is disposed closest to the groove bottom portion 15x is maintained. With such an operation, the disturbance of the attitude and position of the component 2 during conveyance is suppressed and hence, the attitude changing operation of the component 2 can be performed in a stable manner.

Figure 17A:
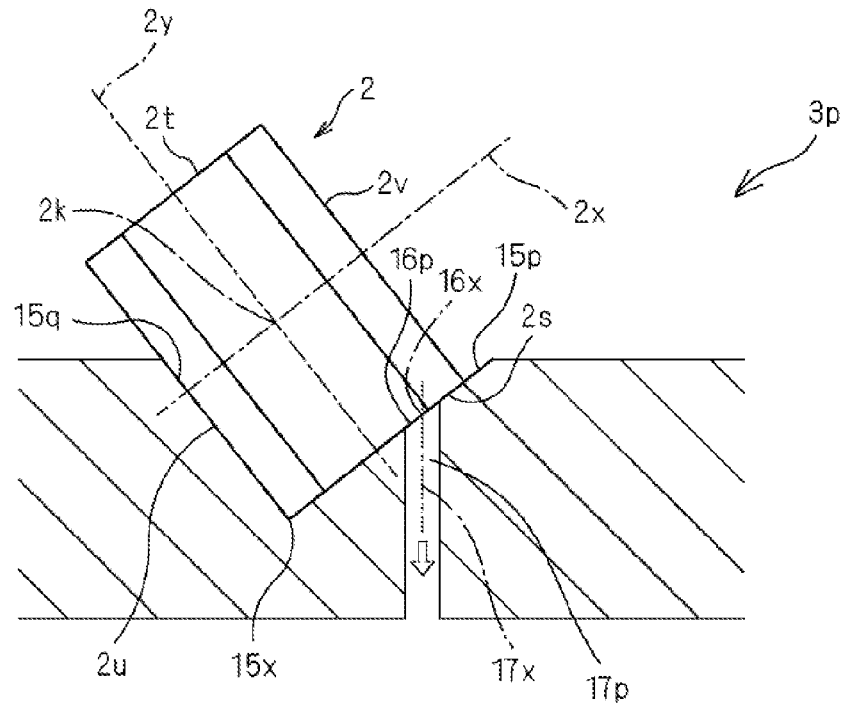
FIGS. 17(*a*) and 17(*b*) are explanatory views showing an imaginary plane (comparison example 1).
Figure 17B:
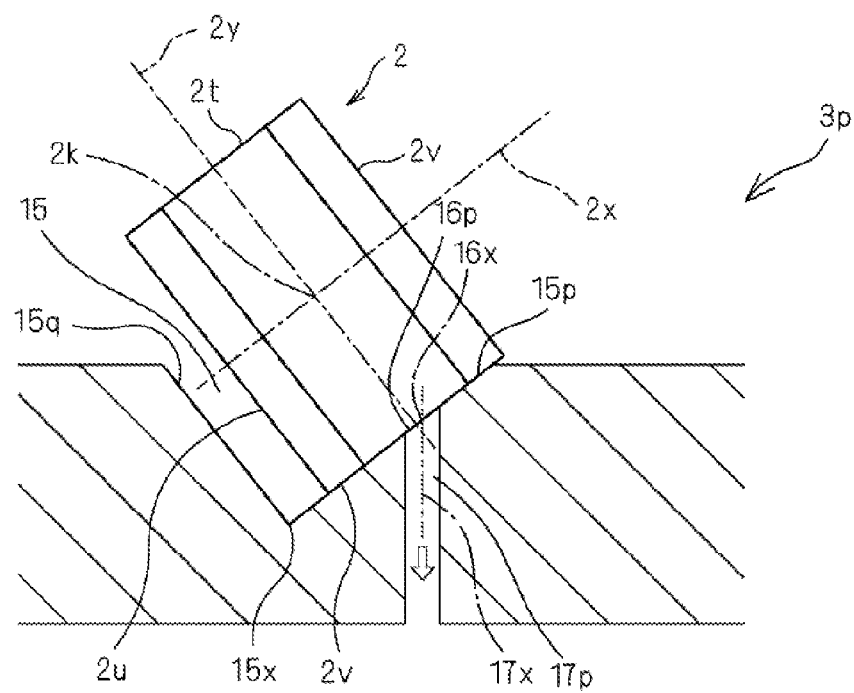

To the contrary, as shown in FIG. 17(a), for example, when a position of the opening center 16x of the suction opening 16p formed in the first inclined surface 15p is disposed outside the region 3a including the groove bottom portion 15x, the component 2 is liable to be sucked and held such that the second plane 2y which passes the center of gravity 2k of the component 2 approaches to the opening center 16x of the suction opening 16p formed in the first inclined surface 15p, that is, the corner of the component 2 moves away from the groove bottom portion 15x. In this case, the disturbance of the attitude and the disturbance of the position of the component 2 during conveyance occur thus giving rise to a possibility that the attitude changing operation of the component 2 becomes unstable.

Accordingly, as described above, it is preferable that the opening center 16x of the suction opening 16p be positioned within the region 3a or on the boundary line of the region 3a on the imaginary plane 3p.

Here, the opening center 16x of one suction opening 16p formed in the first inclined surface 15p is the centroid of a shape on the first inclined surface 15p of one suction opening 16p formed in the first inclined surface 15p. A center line 17x of a suction flow passage 17p which communicates with the suction opening 16p formed in the first inclined surface 15p may or may not be included in the imaginary plane 3p.

FIG. 16(b) shows the imaginary plane 3q which passes the center 16y of one suction opening 16q formed in the second inclined surface 15q and is orthogonal to the engaging groove 15. The component 2 is disposed in the engaging groove 15 such that the center of gravity 2k of the component 2 is included in the imaginary plane 3q, the component 2 is brought into contact with the second inclined surface 15q, and a corner of the component 2 approaches closest to the groove bottom portion 15x. Here, depending on the shape of the engaging groove 15, a gap is formed between the first inclined surface 15p and the component 2 or between the second inclined surface 15q and the component 2.

As shown in FIG. 16(b), the opening center 16y of the suction opening 16q formed in the second inclined surface 15q is, in the same manner as the opening center 16x of the suction opening 16p formed in the first inclined surface 15p, disposed within the region 3a including the groove bottom portion 15x out of four regions 3a to 3d which are formed by dividing the imaginary plane 3q by the first plane 2x which is parallel to the end surface 2s of the component 2 facing the first inclined surface 15p and passes the center of gravity 2k of the component 2 and the second plane 2y which is parallel to the side surface 2u of the component 2 facing the second inclined surface 15q and passes the center of gravity 2k of the component 2, or on the boundary line of the region 3a. In this case, the disturbance of the attitude and position of the component 2 during conveyance is suppressed and hence, the attitude changing operation of the component 2 can be performed in a stable manner.

Here, the center 17y of one suction opening 17q formed in the second inclined surface 15q is the centroid of a shape on the second inclined surface 15q of one suction opening 17q formed in the second inclined surface 15q. A center line 17x of a suction flow passage 17q which communicates with the suction opening 16q formed in the second inclined surface 15q may or may not be included in the imaginary plane 3q.

The same configuration may be adopted also in a case where one third suction opening which overlaps with the groove bottom portion 15x is formed in the first inclined surface 15p and the second inclined surface 15q respectively. That is, an imaginary plane which passes the center of the third suction opening and is orthogonal to the groove bottom portion is assumed. It is sufficient that the center of gravity of the component is included in the imaginary plane, and the center of the third suction opening is disposed within a region including the groove bottom portion out of four regions formed by dividing the imaginary plane by a first surface and a second plane which respectively pass the center of gravity of the component in a state where a corner of the component approaches closest to the groove bottom portion and are parallel to an end surface and a side surface of the component respectively, or on a boundary line of the region. In this case, the centroid of the shape of the third suction opening is the center of a shape of the third suction opening on the first inclined surface 15p and the second inclined surface 15q.

Summary

As has been described heretofore, by rotating a component while the component is sucked to and held on the engaging groove, in the disturbance of the position of the fulcrum of rotation at the time of changing the attitude of the component can be suppressed whereby the attitude of the component can be surely changed. Further, the attitude of the component can be changed without damaging the component.

Figure 18:
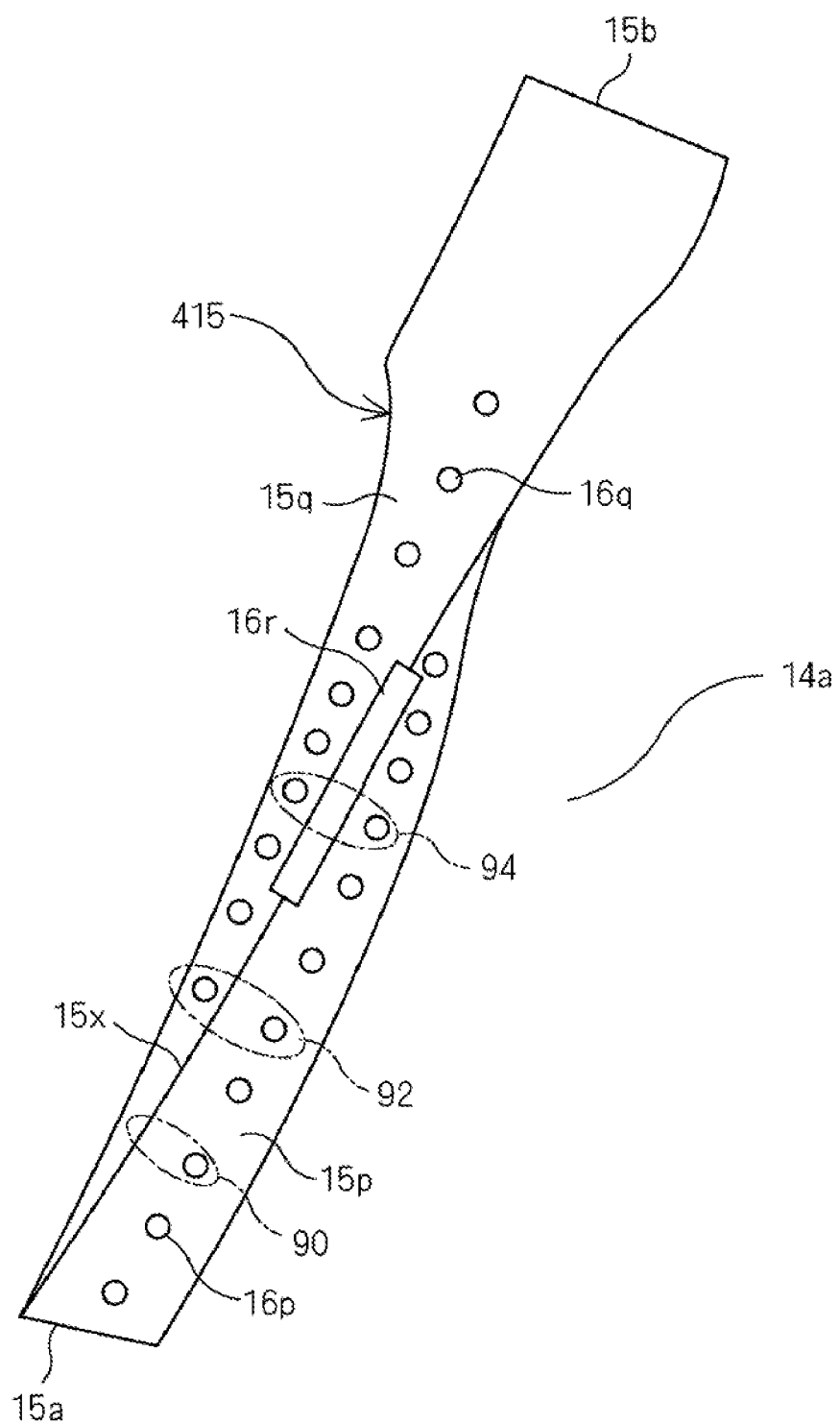
FIG. 18 is a perspective view of a base (explanatory example 1)
Figure 19:
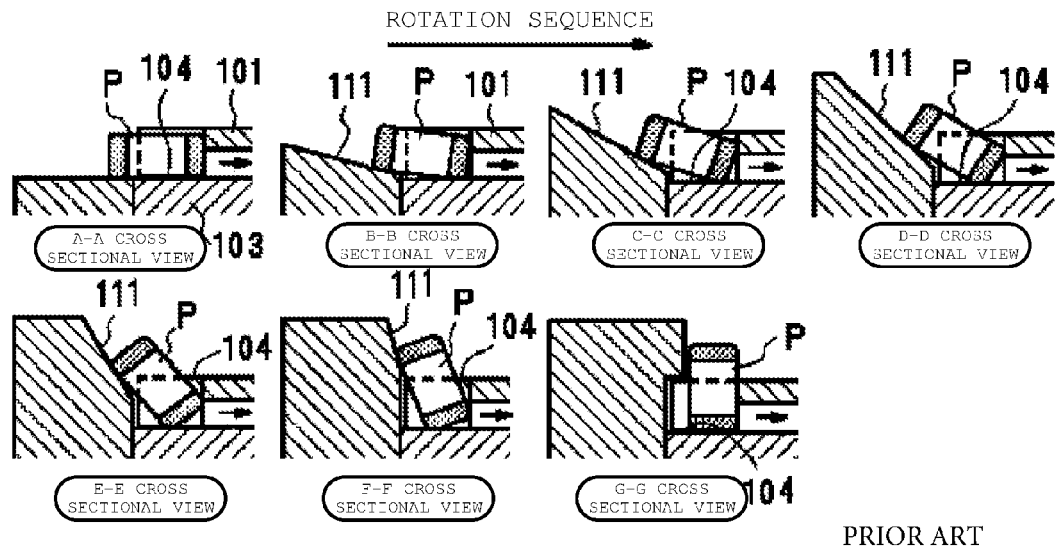
FIG. 19 is an explanatory view of an operation for changing an attitude of a component from a horizontal position to a vertical position (conventional example 1).
Figure 20:
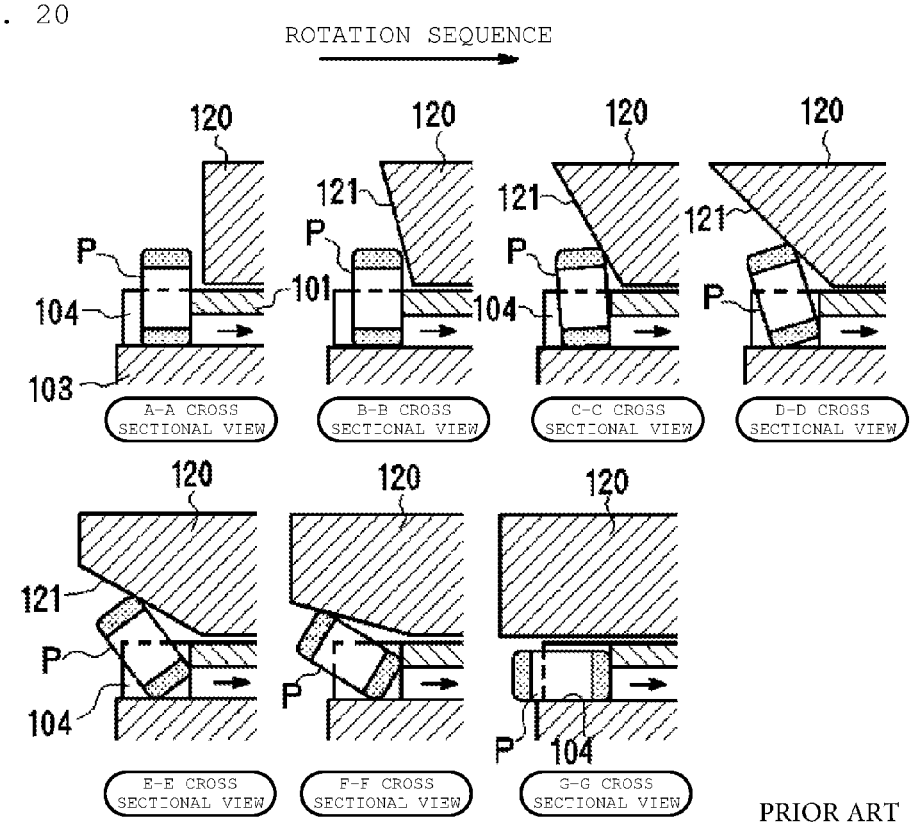
FIG. 20 is an explanatory view of an operation for changing an attitude of a component from a vertical position to a horizontal position (conventional example 2).

FIG. 18 is a perspective view of a reference surface 14a of the base 14 as viewed from above. The present disclosure may include at least one of the following configurations (i) to (iv) as a mode for sucking and holding a component by forming a suction opening in an engaging groove 415.

(i) A pattern where a component 2 is sucked and held by forming a first suction opening only in a first inclined surface 15p out of the first inclined surface 15p and a second inclined surface 15q of the engaging groove 415 as indicated by a portion surrounded by a chain line 90 is shown in FIG. 18, for example.

(ii) A pattern where a component 2 is sucked and held by sucking and holding one surface of a component 2 by a first suction opening hole formed in a first inclined surface 15p, and by sucking and holding the other surface of the component 2 by a second suction opening hole formed in a second inclined surface 15q as indicated by a portion surrounded by a chain line 92 is shown in FIG. 18, for example.

(iii) A pattern where a component 2 is sucked and held by using all of a first suction opening hole formed in a first inclined surface 15p, a second suction opening hole formed in the second inclined surface 15q, and a third suction opening which overlaps with a groove bottom portion 15x together as indicated by a portion surrounded by a chain line 94 is shown in FIG. 18, for example.

(iv) A pattern where a component 2 is sucked to and held by using a first suction opening formed in a first inclined surface 15p, and a third suction opening which overlaps with a groove bottom portion 15x together.

The present disclosure is not limited to the above described embodiments, and the present disclosure can be carried out by adding various changes to the embodiments.

For example, it is also possible to suck and hold a component on first and second inclined surfaces of an engaging groove and to pull the component into a cavity by a method other than air suction. For example, a component can be sucked and held or pulled using static electricity or magnetism. Further, the present disclosure is also applicable to a component which does not have end surfaces in a longitudinal direction of the component.

The invention claimed is:

1. An attitude changing apparatus used for a component having a rectangular parallelepiped shape where the component includes a pair of rectangular end surfaces which are opposite to each other and four side surfaces which connect the end surfaces to each other, the attitude changing apparatus comprising:
 a base having a reference surface and a first engaging groove formed in a groove shape with respect to the reference surface; and
 a conveyance member disposed along the reference surface of the base and having first and second main surfaces which are opposite to each other and a cavity which penetrates between the first and second main surfaces, the cavity being formed such that the component is stored in the cavity either in a state where the end surface of the component is brought into contact with the reference surface or in a state where any one of side surfaces of the component is brought into contact with the reference surface,
 the conveyance member being configured to move relative to the base such that the cavity moves while facing the first engaging groove from a first end to a second end of the first engaging groove, wherein
 the first engaging groove includes: a first groove bottom portion in a linear shape which connects the first end and the second end of the first engaging groove to each other; and a first inclined surface which is disposed adjacently to the first groove bottom portion and extends to one side of the first groove bottom portion; and a second inclined surface which is disposed adjacently to the first groove bottom portion and extends to the other side of the first groove bottom portion,
 the first inclined surface is configured to suck and hold the component,
 the first inclined surface is formed such that
  the inclination of the first inclined surface with respect to the reference surface in a first orthogonal cross section orthogonal to the first groove bottom portion is increased as the first inclined surface extends toward the second end from the first end of the first engaging groove in at least a partial region from the first end to a first predetermined position of the first engaging groove, and
  with respect to the component which is stored in the cavity such that either one of the end surfaces faces the reference surface in the first end,
  as the component is conveyed along the first engaging groove along with the relative movement of the conveyance member with respect to the base while the end surface of the component stored in the cavity is sucked to and held by the first inclined surface, the inclination of the end surface of the component with respect to the reference surface is increased and the inclination of the pair of side surfaces of the component which is opposite to each other with respect to the reference surface is decreased,
 the second inclined surface is formed such that
  the side surface of the component is moved to the reference surface along with the conveyance of the component while the side surface of the component which is stored and conveyed in the cavity is supported in at least a partial region of the engaging groove from the first predetermined position to the second end, and
  the side surface of the component is brought into contact with the reference surface when the component passes the second end of the first engaging groove.

2. An attitude changing apparatus used for a component having a rectangular parallelepiped shape where the component includes a pair of rectangular end surfaces which are opposite to each other and four side surfaces which connect the end surfaces to each other, the attitude changing apparatus comprising:
 a base having a reference surface and a first engaging groove formed in a groove shape with respect to the reference surface; and
 a conveyance member disposed along the reference surface of the base and having first and second main surfaces which are opposite to each other and a cavity which penetrates between the first and second main surfaces, the cavity being formed such that the component is stored in the cavity either in a state where the end surface of the component is brought into contact with the reference surface or in a state where any one of side surfaces of the component is brought into contact with the reference surface,
 the conveyance member being configured to move relative to the base such that the cavity moves while facing the first engaging groove from a first end to a second end of the first engaging groove, wherein
 the first engaging groove includes: a first groove bottom portion in a linear shape which connects the first end and the second end of the first engaging groove to each other; and a first inclined surface which is disposed adjacently to the first groove bottom portion and extends to one side of the first groove bottom portion; and a second inclined surface which is disposed adjacently to the first groove bottom portion and extends to the other side of the first groove bottom portion,
 the first inclined surface is configured to suck and hold the component,
 the first inclined surface is formed such that
  the inclination of the first inclined surface with respect to the reference surface in a first orthogonal cross section orthogonal to the first groove bottom portion is increased as the first engaging groove extends toward the second end from the first end in at least a partial region of the engaging groove from the first end to a first predetermined position, and
  with respect to the component which is stored in the cavity such that any one of the side surfaces faces the reference surface in the first end,
  as the component is conveyed along the first engaging groove along with the relative movement of the conveyance member with respect to the base while the side surface of the component stored in the cavity is sucked to and held by the first inclined surface, the inclination of the pair of side surfaces of the component which is opposite to each other with respect to the reference surface is increased and the inclination of the end surface of the component with respect to the reference surface is decreased and,
 the second inclined surface is formed such that the end surface of the component is moved to the reference surface along with the conveyance of the component while the end surface of the component which is stored and conveyed in the cavity is supported in at least a partial region of the engaging groove from the first predetermined position to the second end, and the end surface of the component is brought into contact with the reference surface when the component passes the second end of the first engaging groove.

3. The attitude changing apparatus according to claim 1, wherein a first suction opening is formed in the first inclined surface so as to allow sucking and holding of the component on the first inclined surface by sucking the component in vacuum through the first suction opening, and a second suction opening is formed in the second inclined surface so as to allow sucking and holding of the component on the second inclined surface by sucking the component in vacuum through the second suction opening.

4. The attitude changing apparatus according to claim 3, wherein a third suction opening which overlaps with the first inclined surface, the first groove bottom portion and the second inclined surface is formed at the first predetermined position or a region in the vicinity of the first predetermined position so as to allow sucking and holding of the component on the first engaging groove by sucking the component in vacuum through the third suction opening.

5. The attitude changing apparatus according to claim 3, wherein an opening center of the one first suction opening on the first inclined surface, an opening center of the one second suction opening on the second inclined surface or an opening center of the one third suction opening on the first inclined surface or on the second inclined surface is, assuming that the center of gravity of the component is included in an imaginary plane which passes the opening center and is orthogonal to a first groove bottom portion, the component is brought into contact with at least one of the first inclined surface and the second inclined surface, and the component is disposed in the first engaging groove such that a corner of the component approaches closest to the first groove bottom portion, positioned within one region which includes the groove bottom portion, or on a boundary line of the region, among four regions obtained by dividing the imaginary plane by a first plane which is disposed parallel to the end surface or the side surface of the component which faces the first inclined surface and passes the center of gravity of the component, and a second plane which is disposed parallel to the end surface or the side surface of the component which faces the second inclined surface and passes the center of gravity of the component.

6. The attitude changing apparatus according to claim 1, wherein an auxiliary suction unit which sucks the component stored in the cavity is provided to the conveyance member, and a suction force of the auxiliary suction unit is set smaller than a force for sucking and holding the component by at least one of the first and the second inclined surface in a region in the vicinity of the first predetermined position.

7. The attitude changing apparatus according to claim 1, wherein the inclination of the first inclined surface with respect to the reference surface in the first orthogonal cross section is gradually increased toward the second end from the first end of the first engaging groove.

8. An aligning apparatus comprising:

the attitude changing apparatus according to claim 1; and a component supply unit configured to supply the component in such a manner that the end surface of the component is brought into contact with the reference surface or in such a manner that the side surface of the component is brought into contact with the reference surface, wherein the first engaging groove and the cavity are formed such that the component supplied to the cavity by the component supply unit in such a manner that the side surface of the component is brought into contact with the reference surface is conveyed while straddling over the first engaging groove in a state where the component is stored in the cavity, and the component is to have an attitude that the side surface of the component is brought into contact with the reference surface when the component passes the second end of the first engaging groove.

9. The aligning apparatus according to claim 8, wherein the base has a second engaging groove formed in a groove shape with respect to the reference surface, and the second engaging groove includes: a second groove bottom portion in a linear shape which connects a third end and a fourth end of the second engaging groove to each other; a third inclined surface which is disposed adjacently to the second groove bottom portion and extends toward one side of the second groove bottom portion, and a fourth inclined surface which is disposed adjacently to the second groove bottom portion and extends toward the other side of the second groove bottom portion, the third inclined surface is configured to suck and hold the component, the conveyance member is configured to move relative to the base such that the cavity moves while facing the second engaging groove from the third end to the fourth end of the second engaging groove, the third inclined surface is formed such that the inclination of the third inclined surface with respect to the reference surface in a second orthogonal cross section orthogonal to the second groove bottom portion is increased in a direction toward the fourth end from the third end of the second engaging groove in at least a partial region from the third end to a second predetermined position of the second engaging groove, and in accordance with the conveyance of the component toward the fourth end from the third end of the second engaging groove along the second engaging groove along with the relative movement of the conveyance member with respect to the base while the side surface of the component stored in the cavity is sucked and held on the third inclined surface, the inclination of the side surface of the component with respect to the reference surface is increased and the inclination of the end surface of the component with respect to the reference surface is decreased, and the fourth inclined surface is formed such that the fourth inclined surface is brought into contact with the end surface of the component which is stored in the cavity and is conveyed, the end surface of the component is moved to the reference surface along with the conveyance of the component in a region of at least a portion of the engaging groove from the second predetermined position to the fourth end, and the end surface of the component is brought into contact with the reference surface when the component passes the fourth end of the second engaging groove.

10. An attitude changing method used for a component having a rectangular parallelepiped shape where the component includes a pair of rectangular end surfaces which are opposite to each other and four side surfaces which connect the end surfaces to each other, the attitude changing method comprising:
a first step of preparing
(a) a base which is configured such that the base has a reference surface and a first engaging groove formed in a groove shape with respect to the reference surface,
the first engaging groove includes: a first groove bottom portion in a linear shape which connects the first end and the second end of the first engaging groove to each other; a first inclined surface which is disposed adjacently to the first groove bottom portion and extends to one side of the first groove bottom portion; and a second inclined surface which is disposed adjacently to the first groove bottom portion and extends to the other side of the first groove bottom portion,
the first inclined surface is configured to suck and hold the component,
the first inclined surface is formed such that the inclination of the first inclined surface with respect to the reference surface in a first orthogonal cross section orthogonal to the first groove bottom portion is increased as the first engaging groove extends toward the second end from the first end in at least a partial region of the engaging groove from the first end to a first predetermined position, and
(b) a conveyance member disposed along the reference surface of the base and having first and second main surfaces which are opposite to each other and a cavity which penetrates between the first and second main surfaces,
the cavity being formed such that the component is stored in the cavity either in a state where the end surface of the component is brought into contact with the reference surface or in a state where any one of side surfaces of the component is brought into contact with the reference surface;
a second step of storing at least the one component into the cavity such that either one of the end surfaces of the component faces the reference surface; and
a third step of moving the conveyance member relative to the base such that the cavity moves while facing the first engaging groove from the first end to the second end of the first engaging groove thus moving the component stored in the cavity along the first engaging groove in a state where the component is stored in the cavity, wherein
the third step comprises:
a first sub step of increasing the inclination of the end surface of the component with respect to the reference surface and decreasing the inclination of a pair of the side surfaces of the component opposite to each other with respect to the reference surface by conveying the component stored in the cavity while sucking and holding the end surface of the component on the first inclined surface; and
a second sub step of moving the side surface of the component to the reference surface while supporting the side surface of the component inclined in the first sub step by the second inclined surface, wherein the component supplied to the cavity in such a manner that the end surface of the component is brought into contact with the reference surface in the second step is changed into an attitude where the side surface of the component is brought into contact with the reference surface when the component passes the second end of the first engaging groove through the third step.

11. An attitude changing method used for a component having a rectangular parallelepiped shape where the component includes a pair of rectangular end surfaces which are opposite to each other and four side surfaces which connect the end surfaces to each other, the attitude changing method comprising:
a first step of preparing
(a) a base which is configured such that the base has a reference surface and a first engaging groove formed in a groove shape with respect to the reference surface,
the first engaging groove includes: a first groove bottom portion in a linear shape which connects the first end and the second end of the first engaging groove to each other; a first inclined surface which is disposed adjacently to the first groove bottom portion and extends to one side of the first groove bottom portion; and a second inclined surface which is disposed adjacently to the first groove bottom portion and extends to the other side of the first groove bottom portion,
the first inclined surface is configured to suck and hold the component,
the first inclined surface is formed such that the inclination of the first inclined surface with respect to the reference surface in a first orthogonal cross section orthogonal to the first groove bottom portion is increased as the first engaging groove extends toward the second end from the first end in at least a partial region of the engaging groove from the first end to a first predetermined position, and
(b) a conveyance member disposed along the reference surface of the base and having first and second main surfaces which are opposite to each other and a cavity which penetrates between the first and second main surfaces,
the cavity being formed such that the component is stored in the cavity either in a state where the end surface of the component is brought into contact with the reference surface or in a state where any one of side surfaces of the component is brought into contact with the reference surface;
a second step of storing the component into the cavity; and
a third step of moving the conveyance member relative to the base such that the cavity moves while facing the first engaging groove from the first end to the second end of the first engaging groove thus moving the component stored in the cavity along the first engaging groove in a state where the component is stored in the cavity, wherein
the third step comprises:
a first sub step of increasing the inclination of the pair of side surfaces of the component opposite to each other with respect to the reference surface and decreasing the inclination of the end surface of the component with respect to the reference surface by conveying the component stored in the cavity while sucking and holding the side surface of the component on the first inclined surface; and
a second sub step of moving the end surface of the component to the reference surface while supporting the end surface of the component inclined in the first sub step by the second inclined surface, wherein the component supplied to the cavity in such a manner that the side surface of the component is brought into contact with the reference surface in the second step is changed into an attitude where the end surface of the component is brought into contact with the reference surface when the component passes the second end of the first engaging groove through the third step.

12. The attitude changing method according to claim 10, wherein, in the third step, the component is sucked and held on the first engaging groove by sucking the component in vacuum through a first suction opening formed in the first inclined surface, by sucking the component in vacuum through a second suction opening formed in the second inclined surface, and by sucking the component in vacuum through a third suction opening which is disposed in a region in the vicinity of the first predetermined position and overlaps with the first inclined surface, the first groove bottom portion and the second inclined surface.

13. An aligning method which includes the attitude changing method described in claim 10, wherein in the second step, the component is supplied to the cavity in such a manner that the end surface of the component is brought into contact with the reference surface or in such a manner that the side surface of the component is brought into contact with the reference surface, the third step includes a third sub step where the component which is stored in the cavity and has the side surface thereof brought into contact with the reference surface is moved along the first engaging groove while the component is made to straddle over the first engaging groove in a state where the component is stored in the cavity, and attitudes of all components which pass the second end of the first engaging groove through the third step are changed into an attitude where the side surface of the component is brought into contact with the reference surface.

14. The aligning method according to claim 13, wherein the base has a second engaging groove formed in a groove shape with respect to the reference surface, and the second engaging groove includes: a second groove bottom portion in a linear shape which connects a third end and a fourth end of the second engaging groove to each other; a third inclined surface which is disposed adjacently to the second groove bottom portion and extends toward one side of the second groove bottom portion, and a fourth inclined surface which is disposed adjacently to the second groove bottom portion and extends toward the other side of the second groove bottom portion, the third inclined surface is configured to suck and hold the component, the third inclined surface is formed such that the inclination of the third inclined surface with respect to the reference surface in a second orthogonal cross section orthogonal to the second groove bottom portion is increased in a direction toward the fourth end from the third end of the second engaging groove in at least a partial region from the third end to a second predetermined position of the second engaging groove, the aligning method further comprises, after the third step, a fourth step where the component stored in the cavity is moved from the third end to the fourth end of the second engaging groove along the second engaging groove in a state where the component is stored in the cavity by moving the conveyance member relative to the base such that the cavity is moved from the third end to the fourth end of the second engaging groove while the cavity faces the second engaging groove, and the fourth step comprises:

a fourth sub step where the inclination of the side surface of the component with respect to the reference surface is increased and the inclination of the end surface of the component with respect to the reference surface is decreased by conveying the component stored in the cavity while sucking and holding the side surface of the component on the third inclined surface; and a fifth sub step where the end surface of the component is moved to the reference surface while supporting the end surface of the component inclined in the fourth step by the second inclined surface, and all components which pass the fourth end of the second engaging groove through the fourth step are brought into an attitude where the end surface of the component is brought into contact with the reference surface.

15. The attitude changing apparatus according to claim 2, wherein a first suction opening is formed in the first inclined surface so as to allow sucking and holding of the component on the first inclined surface by sucking the component in vacuum through the first suction opening, and a second suction opening is formed in the second inclined surface so as to allow sucking and holding of the component on the second inclined surface by sucking the component in vacuum through the second suction opening.

16. The attitude changing apparatus according to claim 15, wherein a third suction opening which overlaps with the first inclined surface, the first groove bottom portion and the second inclined surface is formed at the first predetermined position or a region in the vicinity of the first predetermined position so as to allow sucking and holding of the component on the first engaging groove by sucking the component in vacuum through the third suction opening.

17. The attitude changing apparatus according to claim 16, wherein an opening center of the one first suction opening on the first inclined surface, an opening center of the one second suction opening on the second inclined surface or an opening center of the one third suction opening on the first inclined surface or on the second inclined surface is, assuming that the center of gravity of the component is included in an imaginary plane which passes the opening center and is orthogonal to a first groove bottom portion, the component is brought into contact with at least one of the first inclined surface and the second inclined surface, and the component is disposed in the first engaging groove such that a corner of the component approaches closest to the first groove bottom portion, positioned within one region which includes the groove bottom portion, or on a boundary line of the region, among four regions obtained by dividing the imaginary plane by a first plane which is disposed parallel to the end surface or the side surface of the component which faces the first inclined surface and passes the center of gravity of the component, and a second plane which is disposed parallel to the end surface or the side surface of the component which faces the second inclined surface and passes the center of gravity of the component.

18. The attitude changing method according to claim 11, wherein, in the third step,
the component is sucked and held on the first engaging groove
by sucking the component in vacuum through a first suction opening formed in the first inclined surface,
by sucking the component in vacuum through a second suction opening formed in the second inclined surface, and
by sucking the component in vacuum through a third suction opening which is disposed in a region in the vicinity of the first predetermined position and overlaps with the first inclined surface, the first groove bottom portion and the second inclined surface.

* * * * *